US 8,705,267 B2

(12) United States Patent  
Endo et al.

(10) Patent No.: US 8,705,267 B2
(45) Date of Patent: Apr. 22, 2014

(54) INTEGRATED CIRCUIT, METHOD FOR DRIVING THE SAME, AND SEMICONDUCTOR DEVICE

(75) Inventors: Masami Endo, Kanagawa (JP); Takuro Ohmaru, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 53 days.

(21) Appl. No.: 13/307,060

(22) Filed: Nov. 30, 2011

(65) Prior Publication Data

US 2012/0140550 A1 Jun. 7, 2012

(30) Foreign Application Priority Data

Dec. 3, 2010 (JP) .................. 2010-270534

(51) Int. Cl.
G11C 11/24 (2006.01)
G11C 11/00 (2006.01)
G11C 11/34 (2006.01)
G11C 8/00 (2006.01)

(52) U.S. Cl.
USPC .... 365/149; 365/154; 365/185.08; 365/233.1

(58) Field of Classification Search
USPC ............... 365/149, 154, 185.08, 220, 233.1
See application file for complete search history.

(56) References Cited

U.S. PATENT DOCUMENTS

| 5,731,856 | A | | 3/1998 | Kim et al. |
| 5,744,864 | A | | 4/1998 | Cillessen et al. |
| 6,091,664 | A | * | 7/2000 | Ramanadin .................. 365/154 |
| 6,104,663 | A | * | 8/2000 | Kablanian ................... 365/154 |
| 6,294,274 | B1 | | 9/2001 | Kawazoe et al. |
| 6,317,377 | B1 | * | 11/2001 | Kobayashi .................. 365/220 |
| 6,563,174 | B2 | | 5/2003 | Kawasaki et al. |

(Continued)

FOREIGN PATENT DOCUMENTS

| EP | 1 737 044 A1 | 12/2006 |
| EP | 2 226 847 A2 | 9/2010 |

(Continued)

OTHER PUBLICATIONS

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Trong Phan
(74) *Attorney, Agent, or Firm* — Fish & Richardson P.C.

(57) ABSTRACT

An integrated circuit which can be switched to a resting state and can be returned from the resting state rapidly is provided. An integrated circuit whose power consumption can be reduced without the decrease in operation speed is provided. A method for driving the integrated circuit is provided. The integrated circuit includes a first flip-flop and a second flip-flop including a nonvolatile memory circuit. In an operating state in which power is supplied, the first flip-flop retains data. In a resting state in which supply of power is stopped, the second flip-flop retains data. On transition from the operating state into the resting state, the data is transferred from the first flip-flop to the second flip-flop. On return from the resting state to the operating state, the data is transferred from the second flip-flop to the first flip-flop.

18 Claims, 10 Drawing Sheets

(56) References Cited

U.S. PATENT DOCUMENTS

| | | | |
|---|---|---|---|
| 6,727,522 B1 | 4/2004 | Kawasaki et al. | |
| 6,788,567 B2 | 9/2004 | Fujimori | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,180,800 B2 * | 2/2007 | Kim | 365/233.1 |
| 7,211,825 B2 | 5/2007 | Shih et al | |
| 7,269,780 B2 | 9/2007 | Arima et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,675,810 B2 * | 3/2010 | Kim et al. | 365/233.1 |
| 7,732,819 B2 | 6/2010 | Akimoto et al. | |
| 8,363,452 B2 * | 1/2013 | Yamazaki et al. | 365/149 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0052730 A1 | 3/2003 | Hoshi et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0105302 A1 | 6/2004 | Fujimori | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0010493 A1 | 1/2011 | Kimura et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-126932 A | 4/2004 |
| JP | 2004-186874 A | 7/2004 |
| JP | 2004-273614 A | 9/2004 |
| JP | 2004-273732 A | 9/2004 |
| WO | 2004/114391 A1 | 12/2004 |
| WO | 2009/107408 A1 | 9/2009 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

(56) References Cited

OTHER PUBLICATIONS

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays,"AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YBFE2O4, and YB2FE3O7 Types of Structures for Compounds in the In2O3 and Sc2O3—A2O3—Bo Systems [A; Fe, Ga, or Al; B: Mg, Mn, Fe, Ni, Cu,or Zn] at Temperatures Over 1000° C." Journal of Solid State Chemistry, 1985, vol. 60, pp. 382-384.

Kimizuka, N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMo3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C." Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

(56) References Cited

OTHER PUBLICATIONS

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

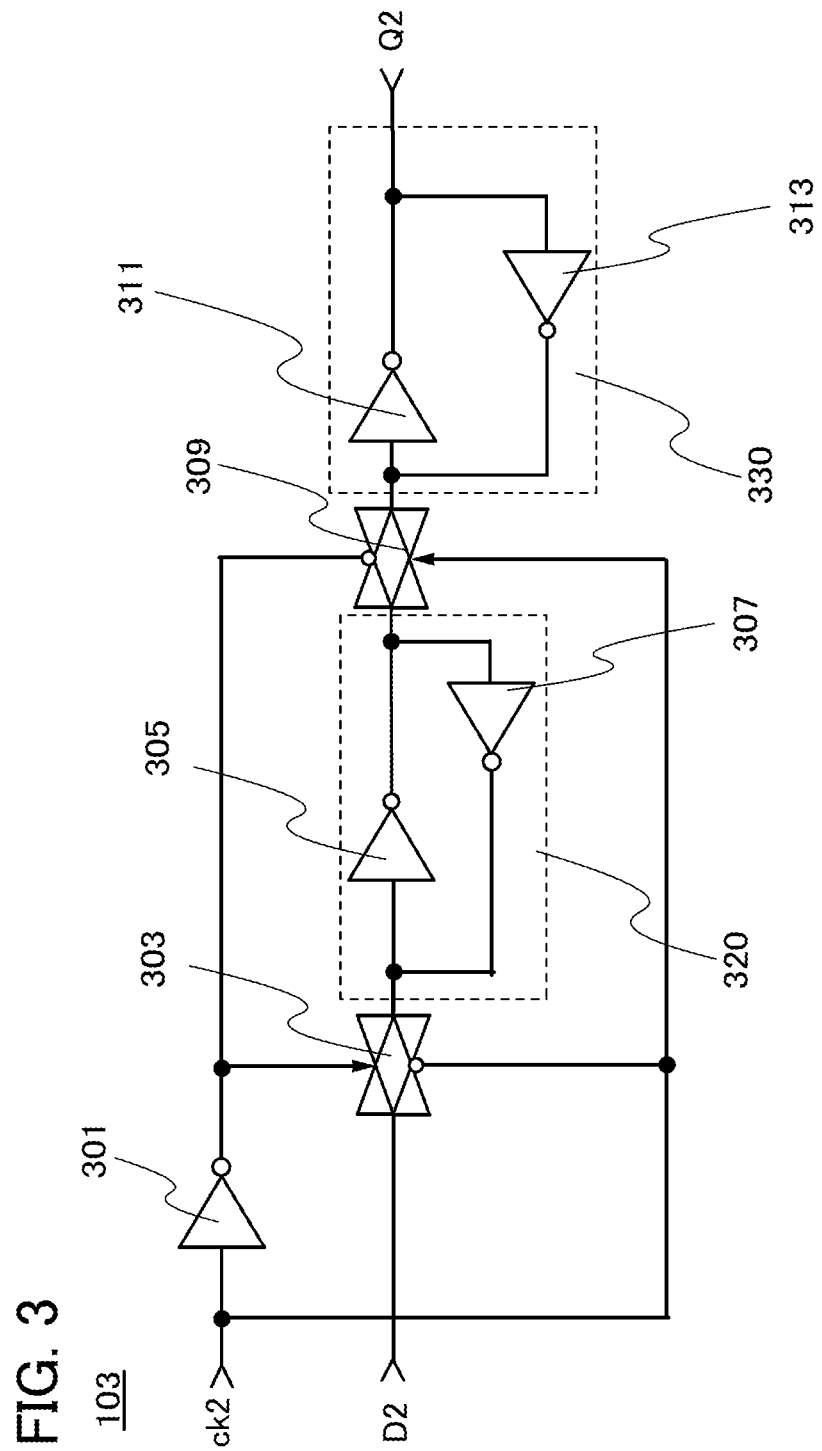

INTEGRATED CIRCUIT, METHOD FOR DRIVING THE SAME, AND SEMICONDUCTOR DEVICE

BACKGROUND OF THE INVENTION

1. Field of the Invention

The present invention relates to a semiconductor circuit, an integrated circuit including a plurality of semiconductor circuits, a method for driving the integrated circuit, and a semiconductor device including the integrated circuit.

2. Description of the Related Art

In recent years, the information society has been increasingly developed, and the demand for higher speed, higher capacity, smaller size, lighter weight, or the like of a personal computer, a cellular phone, or the like has been increased. In the tide of the times, a large-scale integrated circuit (large scale integration (LSI)) and a central processing unit (CPU) need higher integration, higher operation speed, and lower power consumption.

An integrated circuit such as an LSI or a CPU is mounted on a circuit board or a printed wiring board and is used as one of the components of a variety of electronic devices.

An electronic device including an integrated circuit puts importance not only on power consumption in an operating period but also on power consumption in a standby period. In particular, in a portable electronic device, power is supplied from a battery, and the uptime is limited due to a limited amount of power. Further, in an in-car electronic device, when power consumption in a standby period is high, the lifetime of a battery might be reduced. For example, in the case of an electric car, leakage current of an in-car electronic device shortens the travel distance per certain amount of charge.

In order to reduce power consumption of an integrated circuit in a standby period, it is effective to turn off the power in a state in which a semiconductor circuit included in the integrated circuit does not perform computation. For example, a method has been known by which a power breaker is provided over the same chip as an integrated circuit and the integrated circuit is selectively switched to a resting state by the power breaker so that power consumption is reduced (see Reference 1).

Note that in the case where the semiconductor circuit included in the integrated circuit is volatile, when the power of the integrated circuit is turned off, data which is being processed in the semiconductor circuit is lost. As a method for solving such a problem, a method has been disclosed in which a memory circuit portion capable of retaining data even when the power is off is provided separately from an integrated circuit and the power is turned off after data is retained in the memory circuit portion (see References 2 and 3). An integrated circuit disclosed in Reference 2 retains data in a nonvolatile memory circuit portion when the integrated circuit is in a resting state; thus, it is not necessary to supply power to the integrated circuit when the integrated circuit is in the resting state, and power consumption can be reduced.

[Reference]

Reference 1: United States Patent Application Publication No. 2003/052730

Reference 2: PCT International Publication No. 2009/107408

Reference 3: United States Patent Application Publication No. 2004/105302

In order to retain data in an integrated circuit by the above method, data stored in a sequential logic circuit (e.g., a flip-flop (FF)) for retaining data in the integrated circuit is transferred to a nonvolatile memory circuit portion so that the data is retained in the integrated circuit.

However, in the case of a huge integrated circuit or the like including countless FFs, it is necessary to write a large amount of data retained in the countless FFs to a memory circuit portion. Thus, in the case where the memory circuit portion is provided separately from the integrated circuit, a large amount of data is transferred through a limited number of signal lines. Consequently, it takes time to write data from the integrated circuit to the memory circuit portion, so that it is impossible to switch the integrated circuit to a resting state rapidly. As a result, it is impossible to rest the integrated circuit frequently and the effect of reduction in power consumption is decreased.

In addition, it takes time to read the data stored before the rest from the memory circuit portion in a return period and to store the data in each FF in the integrated circuit. Thus, it is difficult to return the integrated circuit from the resting state at high speed.

SUMMARY OF THE INVENTION

The present invention is made in view of the technical background. Thus, it is an object of the present invention to provide an integrated circuit which can be switched to a resting state and can be returned from the resting state rapidly. It is an object of the present invention to provide an integrated circuit whose power consumption can be reduced without the decrease in operation speed. It is an object of the present invention to provide a method for driving the integrated circuit.

Thus, the inventors perform data retention in each FF included in an integrated circuit. The FF is a sequential logic circuit for retaining 1-bit data. Consequently, when data is retained in each FF, even in the case of a huge integrated circuit or the like including countless FFs, each of a plurality of FFs may transfer data per bit, data in the countless FFs can be transferred only in a transfer time of 1-bit data, and the integrated circuit can be switched to a resting state rapidly.

Specifically, a FF (in this specification, referred to as a nonvolatile FF) that stores the operation condition of a high-speed FF (in this specification, referred to as a volatile FF) and can retain data even when supply of power is stopped is electrically connected to each volatile FF.

The high-speed volatile FF is used in an operating period, and data is transferred from the volatile FF to the nonvolatile FF in a standby period. Then, the integrated circuit is switched to a resting state after the supply of power is stopped. Since the nonvolatile FF is provided for each volatile FF, the amount of data to be transferred is small and the data can be transferred in a short time.

In a return period, the data in the volatile FF can be restored by transfer of the 1-bit data in each FF; thus, computation can be restarted rapidly. In addition, output of the data from the nonvolatile FF is controlled by a clock input and the nonvolatile FF is synchronized with the volatile FF; thus, data can be transferred from the nonvolatile FF to the volatile FF certainly.

Further, transition from the operating state into the resting state and return from the resting state to the operating state can be performed rapidly; thus, transition into the resting state can be performed frequently and power consumption can be reduced.

One embodiment of the present invention is an integrated circuit that includes a first flip-flop and a second flip-flop including a nonvolatile memory circuit. In an operating state in which power is supplied, the first flip-flop retains data. In a resting state in which supply of power is stopped, the second flip-flop retains data. On transition from the operating state into the resting state, the data is transferred from the first flip-flop to the second flip-flop. On return from the resting state to the operating state, the data is transferred from the second flip-flop to the first flip-flop.

One embodiment of the present invention is an integrated circuit that includes a first flip-flop and a second flip-flop including a nonvolatile memory circuit. Before a resting state in which supply of power to the first flip-flop and the second flip-flop is stopped, data retained in the first flip-flop is transferred to the second flip-flop. In the resting state, the data is retained in the second flip-flop. After the resting state, the data in the first flip-flop is restored by the second flip-flop.

One embodiment of the present invention is an integrated circuit that includes a selection circuit to which output data from the second flip-flop is input and which selectively outputs any one piece of the data input. Output data from the selection circuit is input to the first flip-flop, and output data from the first flip-flop is input to the second flip-flop.

According to the one embodiment of the present invention, in the integrated circuit, a nonvolatile second flip-flop for retaining data even in the resting state is provided for each first flip-flop. Thus, on the transition into the resting state, a large amount of data is not transferred through a limited number of signal lines but may be transferred to the nonvolatile second flip-flop in each first flip-flop. Consequently, the transfer of the data can be completed in a short time, and the integrated circuit can be switched to the resting state rapidly.

When the integrated circuit can be switched to the resting state rapidly, the integrated circuit can be switched to the resting state frequently; thus, power consumption can be reduced.

Further, in a normal operating period, a general first flip-flop can be used; thus, there are a few limits on the material that can be used, and a material with which a flip-flop can operate at high speed can be selected, for example. Accordingly, power consumption can be reduced without the decrease in operation speed.

In one embodiment of the present invention, in an integrated circuit, a second flip-flop includes a memory circuit that includes a transistor including an oxide semiconductor in a semiconductor layer and a storage capacitor, and an arithmetic portion. In the memory circuit, output data from the first flip-flop is input to a first electrode of the transistor including an oxide semiconductor in the semiconductor layer; a second electrode of the transistor including an oxide semiconductor in the semiconductor layer is electrically connected to a first electrode of the storage capacitor; a second electrode of the storage capacitor is grounded; the first electrode of the storage capacitor and the second electrode of the transistor including an oxide semiconductor in the semiconductor layer form a node. The arithmetic portion includes a logic circuit. The logic circuit includes a transistor whose gate electrode is electrically connected to the node. The arithmetic portion performs operation in accordance with data retained in the node.

According to the one embodiment of the present invention, the second flip-flop is a memory circuit including a transistor where off-state current is reduced and an oxide semiconductor is used and the storage capacitor. Since data is retained in the storage capacitor through the transistor whose off-state current is reduced, it is possible to obtain a nonvolatile flip-flop capable of retaining data even when supply of power is stopped. With the nonvolatile flip-flop, the semiconductor circuit can be switched to the resting state in a short time. Thus, the semiconductor circuit can be switched to the resting state frequently, and power consumption can be reduced.

One embodiment of the present invention is an integrated circuit where a transistor including an oxide semiconductor in a semiconductor layer, and a first flip-flop, an arithmetic portion of a second flip-flop, or a storage capacitor of the second flip-flop are stacked. Thus, even when the second flip-flop including a memory circuit is provided in addition to the first flip-flop, the integrated circuit can be highly integrated without the increase in circuit area.

One embodiment of the present invention is a semiconductor device including the integrated circuit.

One embodiment of the present invention is a method for driving an integrated circuit. In the method, a first flip-flop stores first data in a first period; the first flip-flop outputs the first data and a second flip-flop stores the first data in a second period after the first period; supply of power to the integrated circuit is stopped in a third period after the second period; supply of power to the integrated circuit is returned and the first data stored in the second flip-flop is output in a fourth period after the third period; the first flip-flop stores the first data in a fifth period after the fourth period; the first flip-flop stores second data in a sixth period after the fifth period.

One embodiment of the present invention is a method for driving an integrated circuit that includes a selection circuit to which output data of a second flip-flop is input and which selectively outputs any one piece of the data input. In the method, first data is output from the selection circuit and a first flip-flop stores the first data in a first period; the first flip-flop outputs the first data and a second flip-flop stores the first data in a second period after the first period; supply of power to the integrated circuit is stopped in a third period after the second period; supply of power to the integrated circuit is returned and the first data stored in the second flip-flop is output to the selection circuit in a fourth period after the third period; the first data is output from the selection circuit to the first flip-flop and the first flip-flop stores the first data in a fifth period after the fourth period; second data is output from the selection circuit in a sixth period after the fifth period.

In this specification, a logic circuit is a circuit that performs logic operation, such as an AND circuit or a NOT circuit. A logic circuit is also referred to as a logic operation circuit. Further, in this specification, a circuit in which several logic circuits are combined might be generally referred to as a logic circuit.

In this specification, a flip-flop (FF) is a sequential logic circuit that stores or outputs 1-bit input data in accordance with a control signal. The FF can be formed by a combination of several logic circuits.

In this specification, a semiconductor circuit is a circuit in which a plurality of logic circuits, sequential logic circuits, memory circuits, and the like are combined.

Further, in this specification, ordinal numbers such as "first" and "second" are used for convenience and do not indicate a specific order such as the order of steps or the stacking order of layers. The ordinal numbers do not indicate specific names which specify the invention.

The term "voltage" generally means a difference between potentials at two points (also referred to as a potential difference). However, levels of voltage and potentials are represented by volts (V) in a circuit diagram or the like in some cases, so that it is difficult to distinguish them. Thus, in this specification, a potential difference between a potential at one point and a potential to be a reference (also referred to as a reference potential) is used as voltage at the point in some cases unless otherwise specified.

According to the present invention, it is possible to provide an integrated circuit which can be switched to a resting state and can be returned from the resting state rapidly. It is possible to provide an integrated circuit whose power consumption can be reduced without the decrease in operation speed. It is possible to provide a method for driving the integrated circuit.

BRIEF DESCRIPTION OF THE DRAWINGS

In the accompanying drawings:

FIG. 3 is a circuit diagram of a volatile FF in one embodiment of the present invention;

DETAILED DESCRIPTION OF THE INVENTION

Figure 1:
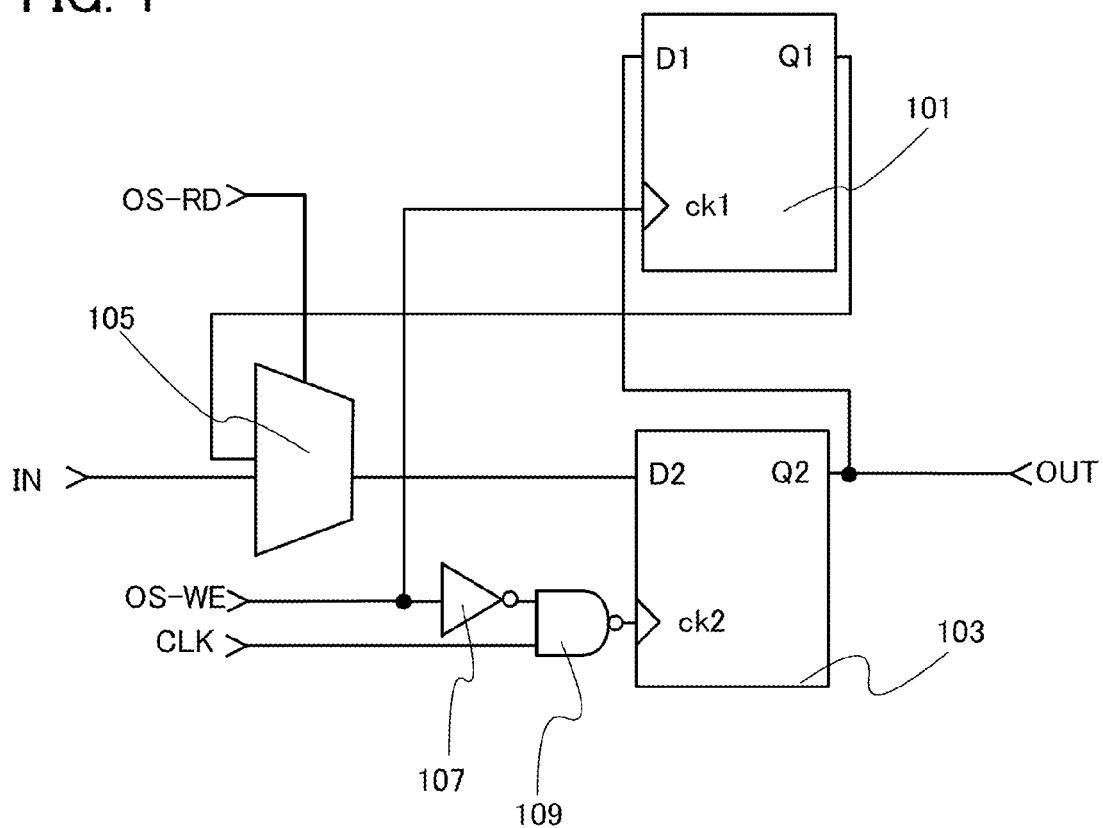
FIG. 1 illustrates a semiconductor circuit in one embodiment of the present invention.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments. Note that in structures of the present invention described below, the same portions or portions having similar functions are denoted by the same reference numerals in different drawings, and description thereof is not repeated.

(Embodiment 1)

In this embodiment, a semiconductor circuit used for an integrated circuit in one embodiment of the present invention is described. The integrated circuit in one embodiment of the present invention includes a plurality of semiconductor circuits described in this embodiment. FIG. 1 illustrates the semiconductor circuit in this embodiment.

The semiconductor circuit illustrated in FIG. 1 includes a nonvolatile FF 101, a volatile FF 103, a selection circuit 105, an inverter circuit 107, and a NAND circuit 109. A first control signal (OS-RD), a second control signal (OS-WE), a clock signal (CLK), external input data (N) are input to the semiconductor circuit, and external output data (OUT) is output from the semiconductor circuit.

The nonvolatile FF 101 includes an input terminal (D1), an output terminal (Q1), and a clock input terminal (ck1). The output terminal (Q1) of the nonvolatile FF 101 is electrically connected to one input terminal of the selection circuit 105. The input terminal (D1) of the nonvolatile FF 101 is electrically connected to an output terminal (Q2) of the volatile FF 103. The second control signal (OS-WE) is input to the clock input terminal (ck1) of the nonvolatile FF 101. The nonvolatile FF 101 stores data input to the input terminal (D1) when an H-level signal is input to the clock input terminal (ck1) of the nonvolatile FF 101. The nonvolatile FF 101 outputs stored data from the output terminal (Q1) when an L-level signal is input to the clock input terminal (ck1). The nonvolatile FF 101 is a FF that includes a memory circuit capable of retaining data even when supply of power is stopped.

Note that an input terminal of a FF is a wiring to which data stored in the FF is input, and an output terminal of the FF is a wiring through which data is output from the FF. A clock input terminal of the FF is a wiring to which a signal for switching the operation of the FF from data storage to data output or from data output to data storage is input.

The nonvolatile FF 101 may include a reset signal input terminal. When a reset signal is input to the reset signal input terminal, the internal state of the FF can be reset at given timing that is not synchronized with a clock.

Figure 2:
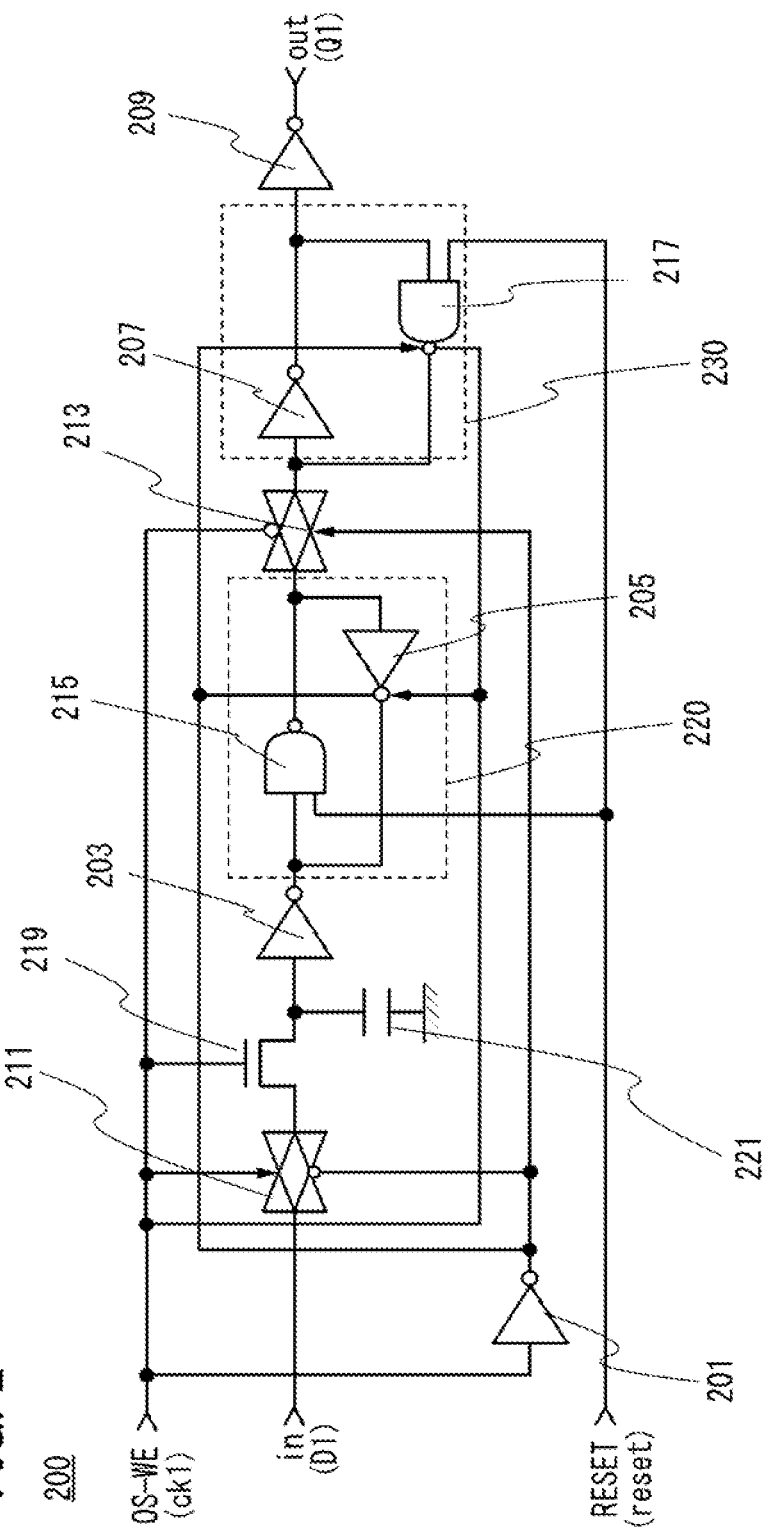
FIG. 2 is a circuit diagram of a nonvolatile FF in one embodiment of the present invention.

Specifically, a circuit used for the nonvolatile FF 101 can be a circuit illustrated in FIG. 2. Note that the specific circuit structure and operation of the nonvolatile FF are described in detail in Embodiment 2.

The volatile FF 103 includes an input terminal (D2), an output terminal (Q2), and a clock input terminal (ck2). The output terminal (Q2) of the volatile FF 103 is electrically connected to the input terminal (D1) of the nonvolatile FF 101 and an output terminal of the semiconductor circuit. The input terminal (D2) of the volatile FF 103 is electrically connected to an output terminal of the selection circuit 105. An output signal of the NAND circuit 109 is input to the clock input terminal (ck2) of the volatile FF 103. The volatile FF 103 stores data input to the input terminal (D2) when an L-level signal is input to the clock input terminal (ck2) of the volatile FF 103. The volatile FF 103 outputs stored data from the output terminal (Q2) when an H-level signal is input to the clock input terminal.

The volatile FF 103 is a circuit that is driven at the time when the semiconductor circuit normally operates. Thus, a circuit that can be driven at high speed is preferable. The volatile FF 103 can be, for example, a circuit illustrated in FIG. 3.

The volatile FF 103 illustrated in FIG. 3 includes a fifth inverter circuit 301, a first analog switch 303, a second analog switch 309, a first latch circuit 320, and a second latch circuit 330.

The first latch circuit 320 includes a first inverter circuit 305 and a second inverter circuit 307. An input terminal of the first latch circuit 320 is electrically connected to the first analog switch 303. An output terminal of the first latch circuit 320 is electrically connected to the second analog switch 309.

Data input to the first latch circuit 320 is inverted by the first inverter circuit 305 and then is output to the second analog switch 309. At the same time, the data inverted by the first inverter circuit 305 is also input to the second inverter circuit 307 and is inverted by the second inverter circuit 307 again to have the same value as the original value. The data inverted by the second inverter circuit 307 is input to the first inverter circuit 305 again, and similar operation is repeated. When data input is fed back in this manner, the first latch circuit 320 retains data stored in a period during which power is supplied. Note that a state in which the first analog switch 303 is on, the second analog switch 309 is off, and data is retained in the first latch circuit 320 as described above is referred to as a state in which data is stored in a volatile FF.

The second latch circuit 330 includes a third inverter circuit 311 and a fourth inverter circuit 313. An input terminal of the second latch circuit 330 is electrically connected to the second analog switch 309. An output terminal of the second latch circuit 330 is electrically connected to the output terminal (Q2). The second latch circuit 330 retains data with a structure and operation that are similar to those of the first latch circuit 320. When the first analog switch 303 is turned off and the second analog switch 309 is turned on, the first latch circuit 320, the second latch circuit 330, and the output terminal of the volatile FF 103 are brought into conduction. A state in which the volatile FF 103 outputs data in this manner is referred to as a state in which a volatile FF outputs data.

The volatile FF 103 stores and outputs data in accordance with a signal input from the clock input terminal (ck2). When an L-level signal is input to the clock input terminal (ck2), an H-level signal which is inverted by the fifth inverter circuit 301 is input to a control terminal of the first analog switch 303, so that the first analog switch 303 is turned on. Note that an analog switch includes a first terminal, a second terminal, and a control terminal. When a signal input to the control terminal is an H-level signal, the analog switch is turned on so that current flows from the first terminal to the second terminal. When a signal input to the control terminal is an L-level signal, the analog switch is turned off so that the flow of current from the first terminal to the second terminal is interrupted. An H-level signal is input to the second analog switch 309, so that the second analog switch 309 is turned off. Thus, data input from the input terminal (D2) is retained in the first latch circuit 320.

Then, when an H-level signal is input to the clock input terminal (ck2), the first analog switch 303 is turned off and the second analog switch 309 is turned on. Thus, data retained in the first latch circuit 320 is input to and retained in the second latch circuit 330 and is output to the output terminal (Q2).

In the volatile FF 103, only a volatile logic circuit retains data; thus, the data is lost when supply of power is stopped. Note that a volatile FF used in the present invention is not limited to the circuit illustrated in FIG. 3. A circuit with a different structure may be used as long as it operates as a FF.

Note that a clock signal is a signal that alternates between an H level (also referred to as an H-level signal or a high power supply potential level) and an L level (also referred to as an L-level signal or a low power supply potential level) at regular intervals. In a flip-flop, a clock signal is a signal input from a clock input terminal and serves as a control signal for switching the operation of the flip-flop from data storage to data output.

The volatile FF 103 may include a reset signal input terminal as in the nonvolatile FF 101.

The selection circuit 105 illustrated in FIG. 1 includes two input terminals. Output data from the nonvolatile FF 101 is input to one of the input terminals. External input data (IN) is input to the other of the input terminals. The selection circuit 105 includes one output terminal. The output terminal of the selection circuit 105 is electrically connected to the input terminal (D2) of the volatile FF 103. The selection circuit 105 is a circuit for selecting data to be input to the volatile FF 103. One of two pieces of data input to the two input terminals of the selection circuit 105 is output from the output terminal of the selection circuit 105. Which data to output from the selection circuit 105 is controlled by the first control signal (OS-RD). When an H-level signal is input as the first control signal, the selection circuit 105 outputs the output data from the nonvolatile FF 101. When an L-level signal is input, the selection circuit 105 outputs the external input data (IN).

The second control signal (OS-WE) is input to an input terminal of the inverter circuit 107. An output terminal of the inverter circuit 107 is electrically connected to one input terminal of the NAND circuit 109. The clock signal (CLK) is input to the other input terminal of the NAND circuit 109. An output terminal of the NAND circuit 109 is electrically connected to the clock input terminal (ck2) of the volatile FF 103. Thus, when the second control signal (OS-WE) is an L-level signal, an inversion signal of the clock signal (CLK) is input to the clock input terminal of the volatile FF 103. When the second control signal (OS-WE) is an H-level signal, an H-level signal is always input to the clock input terminal of the volatile FF 103 regardless of the level of the clock signal (CLK).

Then, a method for operating the semiconductor circuit in this embodiment is described with reference to timing charts in FIGS. 4A and 4B. Note that for simple description, an L level is 0 V; however, this embodiment is not limited thereto.

Figure 4A:
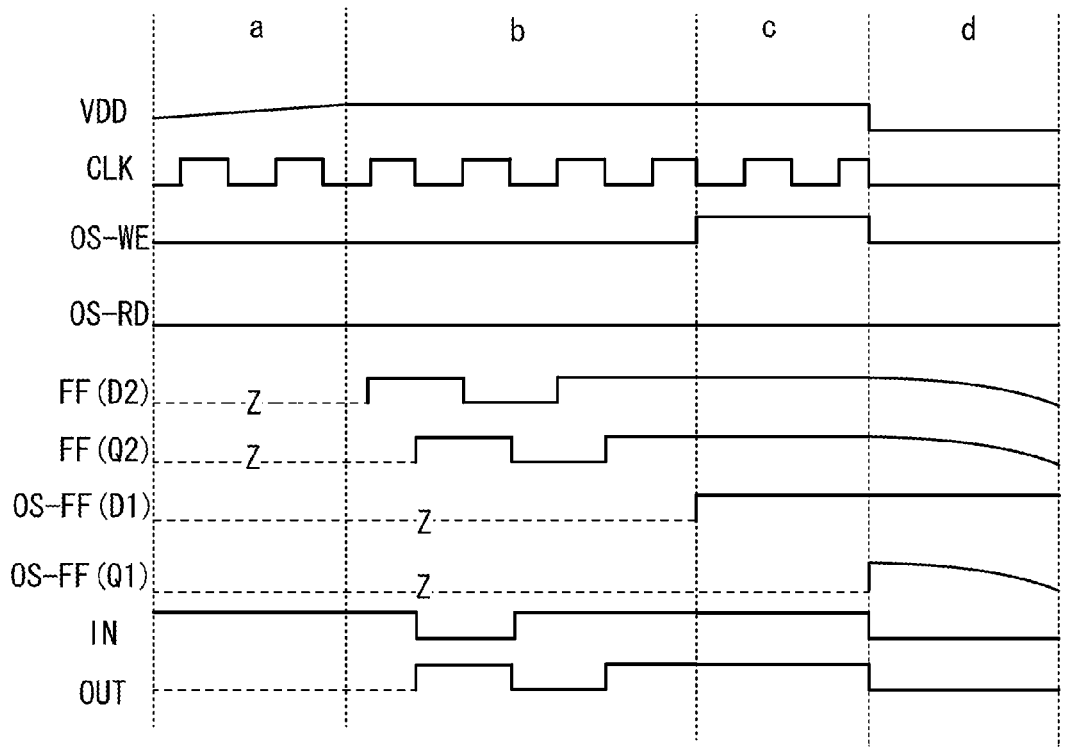
FIGS. 4A and 4B are timing charts illustrating the operation of a semiconductor circuit in one embodiment of the present invention.
Figure 4B:
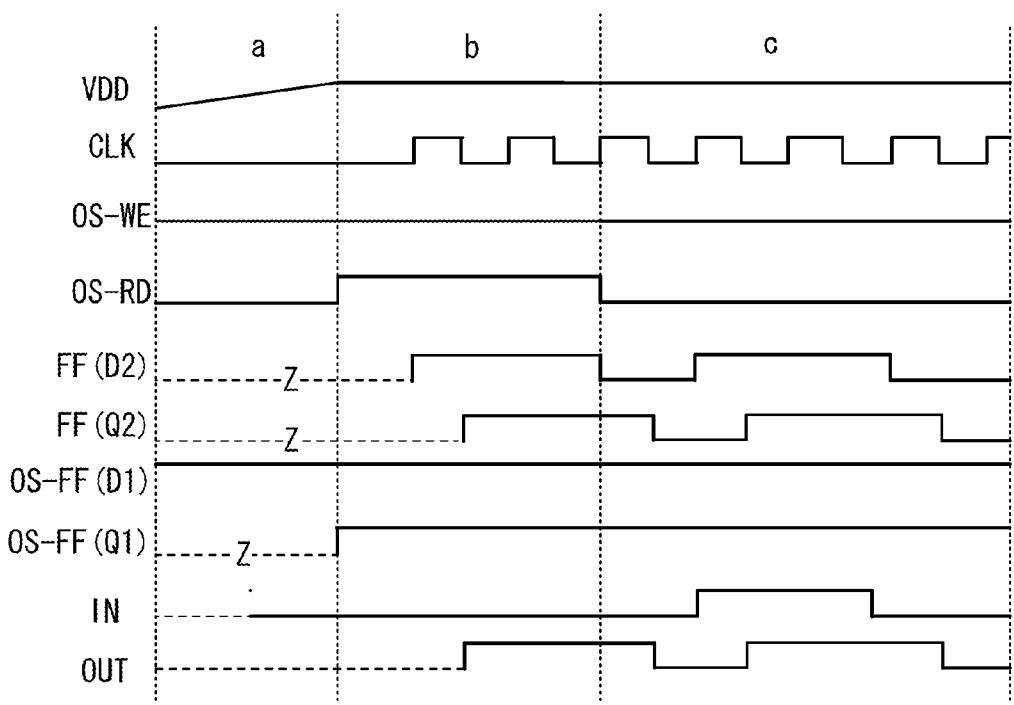

In the timing charts in FIGS. 4A and 4B, VDD is the power of a semiconductor circuit. When the power of the semiconductor circuit is turned on, power is supplied to a logic circuit in the semiconductor circuit; thus, the volatile FF 103 can store and output data. However, when the power of the semiconductor circuit is turned off and supply of power to the logic circuit is stopped, data storage and data output are also stopped, so that the data stored is lost. Note that the nonvolatile FF 101 in this embodiment can retain data even when supply of power and the operation of the logic circuit are stopped.

In the timing charts in FIGS. 4A and 4B, FF (D2) indicates data stored in the volatile FF 103, and FF (Q2) indicates data output from the volatile FF 103. In addition, OS-FF (D1) indicates data stored in the nonvolatile FF 101, and OS-FF (Q1) indicates data output from the nonvolatile FF 101.

The timing chart in FIG. 4A shows a period $a$ during which the power is turned on so that the semiconductor circuit is started, a period $b$ during which the volatile FF 103 operates normally, a period $c$ during which data in the volatile FF 103 is transferred to and stored in the nonvolatile FF 101 on transition into a resting state, and a period $d$ during which the power of the semiconductor circuit is turned off so that the semiconductor circuit is switched to the resting state.

The timing chart in FIG. 4B shows a period $a$ during which the power is turned on so that the semiconductor circuit is started on return from the resting state of the semiconductor circuit, a period $b$ during which data stored in the nonvolatile FF is transferred to the volatile FF and the volatile FF restores the data stored before the rest, and a period $c$ during which the volatile FF operates normally again.

In the semiconductor circuit in this embodiment, the external input data (N) is input to the volatile FF 103 in a normal operating period, the volatile FF stores the external input data (IN), and the data stored in the volatile FF 103 is output as the external output data (OUT).

First, initial operation up until the start of the semiconductor circuit is described. As illustrated in the period a in FIG. 4A, the power VDD of the semiconductor circuit is turned on.

At this time, the clock signal (CLK) is also input; however, even when the clock signal (CLK) is input, the volatile FF 103 performs neither data storage nor data output until the semiconductor circuit is completely started. The internal state of the volatile FF 103 at this time is indeterminate (Z). In the case where the volatile FF includes a reset signal input terminal, a reset signal may be input at this timing so that the internal state of the volatile FF is determined.

The semiconductor circuit starts to operate after the power VDD is completely turned on. In a first period (the period $b$ in FIG. 4A), the volatile FF 103 operates normally in accordance with the clock signal (CLK). At this time, since the first control signal (OS-RD) remains at the L level, the external input data (IN) is output from the selection circuit 105 to the input terminal (D2) of the volatile FF 103. At this time, when the clock signal (CLK) becomes an H level, the volatile FF 103 stores the external input data (IN), and when the clock signal (CLK) becomes an L level, the volatile FF 103 outputs the data stored.

At this time, the data output is extracted as the external output data (OUT) of the semiconductor circuit and is output to the input terminal (D1) of the nonvolatile FF 101. However, since the second control signal (OS-WE) remains at the L level, the data input to the input terminal (D1) of the nonvolatile FF is not stored in the nonvolatile FF 101, and the internal state of the nonvolatile FF 101 remains indeterminate.

A second period (the period $c$ in FIG. 4A) following the first period is a period during which the data is transferred from the volatile FF 103 to the nonvolatile FF 101 in order that the semiconductor circuit be switched to the resting state.

In the second period, first, an H-level signal is input as the second control signal (OS-WE). When the H-level signal is input as the second control signal (OS-WE), H-level signals are input to the clock input terminal (ck1) of the nonvolatile FF 101 and the clock input terminal (ck2) of the volatile FF 103.

When the H-level signal is input to the clock input terminal (ck2) of the volatile FF 103, the volatile FF 103 outputs the data stored.

When the H-level signal is input to the clock input terminal (ck1) of the nonvolatile FF 101, the nonvolatile FF 101 stores data input to the input terminal (D1). At this time, the data input to the input terminal (D1) of the nonvolatile FF 101 is data output from the volatile FF 103 in accordance with the second control signal (OS-WE). Thus, the nonvolatile FF 101 stores data which was output from the volatile FF 103 just before the H-level signal is input to the clock input terminal (ck1).

The data can be transferred from the volatile FF 103 to the nonvolatile FF 101 at high speed. This is because the data retained in the FF is 1-bit data and the transfer of the data is completed in an extremely short time.

In a third period (the period $d$ in FIG. 4A) following the second period, the power of the semiconductor circuit is turned off. Here, the description "the power of the semiconductor circuit is turned off" means that supply of power to the logic circuit in the semiconductor circuit and supply of all the signals and data that are input to the semiconductor circuit are stopped.

At this time, the second control signal (OS-WE) is changed from an H level into an L level (0 V); thus, the nonvolatile FF 101 starts to output the data stored. Note that at the same time, the power of the semiconductor circuit is turned off and supply of power to the logic circuit in the nonvolatile FF 101 is stopped. Thus, as illustrated in the period $d$ in FIG. 4A, the operation of the nonvolatile FF 101 is switched, OS-FF (Q1) becomes an H level, and then, supply of power is stopped and output of data from the nonvolatile FF is stopped. Note that actually, since the operation of the nonvolatile FF 101 is switched from data storage to data output and the supply of power is stopped in a short time, data is not output from the nonvolatile FF 101. However, in the period d in FIG. 4A, the supply of power is stopped after OS-FF (Q1) becomes an H level in order to clearly show that the operation of the nonvolatile FF 101 is switched.

In the period $d$ in FIG. 4A, since supply of power to the logic circuit included in the semiconductor circuit is stopped, the operation of the logic circuit is stopped. Thus, data (FF (D2)) stored in the volatile FF 103 is lost. However, since the nonvolatile FF 101 can retain data even when supply of power is stopped, data (OS-FF (D1)) stored in the nonvolatile FF 101 is continuously retained.

The data retained in the nonvolatile FF 101 at this time is the data which is output just before the volatile FF 103 is switched to the resting state.

Through the above steps, the semiconductor circuit transfers data output from the volatile FF to the nonvolatile FF on transition into a resting state, and the nonvolatile FF retains the data in a period during which supply of power is stopped; thus, the semiconductor circuit can be switched to the resting state while the data is continuously retained. Further, data transfer is performed in each FF; thus, the transition into the resting state can be performed at high speed.

In a fourth period (the period $a$ in FIG. 4B) following the third period, in order to return the semiconductor circuit from the resting state, the power of the semiconductor circuit is turned on again so that the operation of the semiconductor circuit is restarted. At this time, the nonvolatile FF 101 retains data which is output just before the transition of the FF 103 into the resting state.

When the semiconductor circuit is started and the logic circuit in the semiconductor circuit starts to operate, data stored in the nonvolatile FF 101 is output to the selection circuit 105.

In a fifth period (the period $b$ in FIG. 4B) following the fourth period, the selection circuit 105 outputs the data to the volatile FF 103 and the volatile FF 103 stores the data. In the fifth period, first, an H-level signal is input as the first control signal (OS-RD). When the H-level signal is input as the first control signal (OS-RD), the selection circuit 105 outputs data input from the nonvolatile FF 101.

Next, the clock signal (CLK) is input. The clock signal (CLK) is input to the one input terminal of the NAND circuit 109. At this time, a signal obtained by inversion of the second control signal (OS-WE) by the inverter circuit 107, i.e., an H-level signal is input to the other input terminal of the NAND circuit 109. Thus, an inversion signal of the clock signal (CLK) is output from the output terminal of the NAND circuit 109. Data output from the NAND circuit is input to the clock input terminal (ck2) of the volatile FF 103, and the volatile FF 103 stores and outputs the data.

When the clock signal (CLK) becomes an H level, the volatile FF 103 stores data input to the input terminal (D2). At this time, the data input to the input terminal (D2) of the volatile FF 103 is data output from the nonvolatile FF 101 through the selection circuit 105.

The data output from the nonvolatile FF 101 is the data transferred from the volatile FF 103 on the transition into the resting state. In other words, here, the volatile FF 103 stores data which is retained just before the transition into the resting state and the data is restored to a state before the resting state.

In a sixth period (the period $c$ in FIG. 4B) following the fifth period, the external input data (IN) is input from the selection circuit 105 to the volatile FF 103 so that the normal operation of the semiconductor circuit is restarted.

In the sixth period, first, an L-level signal is input as the first control signal (OS-RD). When the L-level signal is input as the first control signal (OS-RD), the selection circuit 105 outputs the external input data (IN).

Thus, the external input data (IN) is input to the input terminal of the volatile FF 103, and the external output data (OUT) is output in accordance with a signal input to the clock input terminal (ck2).

As described above, in the semiconductor circuit in this embodiment, data storage and data output are performed using a volatile FF capable of being driven at high speed in a normal operating period, the power is turned off after data stored in the volatile FF is transferred to a nonvolatile FF on transition into a resting state, and the data is retained in the nonvolatile FF while supply of power is stopped. Further, on return from the resting state, by transfer of the data retained in the nonvolatile FF to the volatile FF, normal operation is performed after the state of the volatile FF is restored to a state before the transition into the resting state.

An integrated circuit in the present invention is an integrated circuit including a plurality of the semiconductor circuits. For example, the integrated circuit in the present invention includes a register in which a plurality of the semiconductor circuits in this embodiment are arranged to retain data, a memory in which the semiconductor circuits are stacked as basic components, or the like. Data may be transferred in each FF on transition into a resting state when a plurality of the semiconductor circuits perform the above operation. Data transfer can be completed in a short time, and transition into the resting state can be performed rapidly.

With the use of the semiconductor circuit in this embodiment, it is possible to provide an integrated circuit which can be switched to a resting state and can be returned from the resting state rapidly. It is possible to provide an integrated circuit whose power consumption can be reduced without the decrease in operation speed. It is possible to provide a method for driving the integrated circuit.

This embodiment can be combined with any of the other embodiments.

(Embodiment 2)

In this embodiment, the circuit structure of the nonvolatile FF in Embodiment 1 is described. FIG. 2 illustrates an example of the circuit structure of the nonvolatile FF.

The nonvolatile FF includes a memory circuit and an arithmetic portion. A nonvolatile FF 200 illustrated in FIG. 2 includes a transistor 219 including an oxide semiconductor in a semiconductor layer and a storage capacitor 221 as the memory circuit, and a first inverter circuit 203, a second inverter circuit 209, a first analog switch 211, a second analog switch 213, a first latch circuit 220, and a second latch circuit 230 as the arithmetic portion.

The transistor 219 has a gate electrode, a first electrode, and a second electrode, and includes an oxide semiconductor in the semiconductor layer. A channel formation region of the transistor 219 includes a highly purified oxide semiconductor; thus, the transistor 219 has extremely low off-state current.

The gate electrode of the transistor 219 is electrically connected to the clock input terminal (ck1) of the nonvolatile FF 200, and the second control signal (OS-WE) is input to the gate electrode of the transistor 219. The first electrode of the transistor 219 is electrically connected to the first analog switch 211. The second electrode of the transistor 219 is electrically connected to a first electrode of the storage capacitor 221 and an input terminal of the first inverter circuit 203.

The storage capacitor 221 has the first electrode and a second electrode. The first electrode of the storage capacitor 221 is electrically connected to the second electrode of the transistor 219 and the input terminal of the first inverter circuit 203. The second electrode of the storage capacitor 221 is grounded.

The second electrode of the transistor 219 including an oxide semiconductor in the semiconductor layer and the first electrode of the storage capacitor 221 form a node in which electrical charge is stored.

The first inverter circuit 203 includes a transistor whose gate electrode is electrically connected to the node. When the gate electrode of the transistor, the second electrode of the transistor 219 including an oxide semiconductor in the semiconductor layer, and the first electrode of the storage capacitor 221 form the node, it is possible to store electrical charge in the storage capacitor 221 even when supply of power is stopped. An output terminal of the first inverter circuit 203 is electrically connected to an input terminal of the first latch circuit 220.

Note that the transistor included in the first inverter circuit 203 does not need to include an oxide semiconductor in a semiconductor layer. In the nonvolatile FF 200, transistors other than the transistor 219 do not affect data retention; thus, transistors formed using silicon or the like that can be driven at high speed are preferably used.

The first latch circuit 220 includes a third inverter circuit 205 and a NAND circuit 215. An input terminal of the first latch circuit 220 is electrically connected to the output terminal of the first inverter circuit 203. An output terminal of the first latch circuit 220 is electrically connected to the second analog switch 213. The third inverter circuit 205 is a clocked inverter circuit which operates in accordance with a signal from the clock input terminal (ck1). Thus, the first latch circuit operates in synchronization with a clock signal, so that data can be input and output more accurately. Note that as the third inverter circuit 205, a normal inverter circuit which does not have a function of synchronization with a clock signal can be used.

The second latch circuit 230 includes a fourth inverter circuit 207 and a NAND circuit 217. An input terminal of the second latch circuit 230 is electrically connected to the second analog switch 213. An output terminal of the second latch circuit 230 is electrically connected to an input terminal of the second inverter circuit 209. The NAND circuit 217 is a clocked NAND circuit.

The nonvolatile FF 200 in this embodiment further includes a reset input terminal (reset). One input terminal of the NAND circuit 215 and one input terminal of the NAND circuit 217 are electrically connected to the reset input terminal (reset) of the nonvolatile FF 200, and a reset signal (RESET) is input to the first latch circuit 220 and the second latch circuit 230. When an L-level signal is input as the reset signal (RESET), data retained in the latch circuits can be rewritten. Thus, data in the nonvolatile FF 200 can be reset at given timing independently of the timing of a clock.

Note that an H-level signal is input as the reset signal (RESET) in a period other than a period during which data is reset. While an H-level signal is input as the reset signal, each of the NAND circuit 215 and the NAND circuit 217 inverts data input to the other input terminal and outputs the data inverted.

Data input to the first latch circuit 220 is inverted by the NAND circuit 215 and then is output to the second analog switch 213. At the same time, the data inverted by the NAND circuit 215 is also input to the third inverter circuit 205 and is inverted by the third inverter circuit 205 again to have the same value as the original value. The data inverted by the third inverter circuit 205 is input to the NAND circuit 215 again, and similar operation is repeated. When data input is fed back in the first latch circuit 220 in this manner, the first latch circuit 220 retains data. The second latch circuit retains data similarly.

An input terminal of the second inverter circuit 209 is electrically connected to the output terminal of the second latch circuit 230. The output terminal of the second inverter circuit 209 is electrically connected to the output terminal (Q1) and outputs output data (out).

The first analog switch 211 and the second analog switch 213 each include a first terminal, a second terminal, and a control terminal. When a signal input to the control terminal is an H-level signal, each of the first analog switch 211 and the second analog switch 213 is turned on so that current flows from the first terminal to the second terminal. When a signal input to the control terminal is an L-level signal, each of the first analog switch 211 and the second analog switch 213 is turned off so that the flow of current from the first terminal to the second terminal is interrupted. The first terminal of the first analog switch 211 is electrically connected to the input terminal (D1), and input data (in) is input to the first terminal of the first analog switch 211. The second terminal of the first analog switch 211 is electrically connected to the first electrode of the transistor 219 including an oxide semiconductor in the semiconductor layer. The control terminal of the first analog switch 211 is electrically connected to the clock input terminal (CLK), and the second control signal (OS-WE) is input to the control terminal of the first analog switch 211. The first terminal of the second analog switch 213 is electrically connected to the output terminal of the first latch circuit 220. The second terminal of the second analog switch 213 is electrically connected to the input terminal of the second latch circuit 230. The control terminal of the second analog switch 213 is electrically connected to a fifth inverter circuit 201.

The fifth inverter circuit 201 is electrically connected to the clock input terminal (ck1), and the second control signal (OS-WE) is input to the fifth inverter circuit 201. The second control signal (OS-WE) is inverted by the fifth inverter circuit 201, and then is input to the second analog switch 213 and the NAND circuit 217.

The first analog switch 211 and the second analog switch 213 are turned on or off in accordance with the second control signal (OS-WE). Specifically, when the second control signal (OS-WE) is an H-level signal, an H-level signal is input to the first analog switch 211, so that the first analog switch 211 is turned on. At this time, an L-level signal which is inverted by the fifth inverter circuit 201 is input to the second analog switch 213, so that the second analog switch 213 is turned off. In contrast, when the second control signal is an L-level signal, the first analog switch 211 is turned off and the second analog switch 213 is turned on. Since opposite signals are always input to the first analog switch 211 and the second analog switch 213, when one of the analog switches is on, the other of the analog switches is inevitably off, that is, both of the analog switches are not on at the same time.

Next, the following successive operation is described: data is stored in the nonvolatile FF 200 (the period $c$ in FIG. 4A), the data is retained even when supply of power is stopped (the period $d$ in FIG. 4A), the power is turned on again (the period $a$ in FIG. 4B), and the data is output (the period $b$ in FIG. 4B).

First, a method for storing data in the nonvolatile FF 200 is described. Note that in this embodiment, the data described in Embodiment 1 is input and output as the input data (in) and the output data (out), and detailed description thereof is omitted.

When data is stored in the nonvolatile FF 200, first, an H-level signal is input as the second control signal (OS-WE) (the period c in FIG. 4A). When the H-level signal is input as the second control signal (OS-WE), an L-level signal inverted by the fifth inverter circuit 201 is input to the second analog switch 213. When the L-level signal is input, the second analog switch 213 is turned off, and data is not input to the second latch circuit 230. In contrast, an H-level signal is input to the first analog switch 211, so that the first analog switch 211 is turned on.

At the same time, the H-level signal is input to the gate electrode of the transistor 219. The transistor 219 includes an oxide semiconductor in the semiconductor layer and is an n-channel transistor. Thus, at this time, the transistor 219 is turned on, and the input data (in) passing through the first analog switch 211 is input to the storage capacitor 221 and the first inverter circuit 203 through the transistor 219.

After the input data is input to the storage capacitor 221, the input data (in) is retained.

When the data is input to the first inverter circuit 203, the data input is inverted and output to the first latch circuit 220.

The data input to the first latch circuit 220 is inverted by the NAND circuit 215 and then is output to the second analog switch 213. However, since the second analog switch 213 is off at this time, data is not input to the second latch circuit 230.

At the same time, the data inverted by the NAND circuit 215 is also input to the third inverter circuit 205 and is inverted by the third inverter circuit 205 again to have the same value as the original value. The data inverted by the third inverter circuit 205 is input to the NAND circuit 215 again, and similar operation is repeated. When data input is fed back in the first latch circuit 220 in this manner, the first latch circuit 220 retains data.

Note that a state in which the first analog switch 211 is on, the second analog switch 213 is off, and data is retained in the first latch circuit as described above is referred to as a state in which data is stored in a nonvolatile FF.

In contrast, a state in which the first analog switch 211 is off, the second analog switch 213 is on, the first latch circuit 220, the second latch circuit 230, the second inverter circuit 209, and the output terminal (Q1) of the nonvolatile FF 200 are brought into conduction, and the nonvolatile FF 200 outputs a signal is referred to as a state in which a nonvolatile FF outputs data.

Next, an L-level signal is input as the second control signal (OS-WE) (the period d in FIG. 4A). When the L-level signal is input as the second control signal, the first analog switch 211 and the transistor 219 are turned off. After the transistor 219 is turned off, the node formed by the second electrode of the transistor and the first electrode of the storage capacitor and the gate electrode of the transistor that serves as the input terminal of the first inverter circuit 203 enter into an electrically insulated floating state.

The off-state current of the transistor 219 including an oxide semiconductor in the semiconductor layer is lower than or equal to one hundred thousandth of the off-state current of a transistor including a silicon semiconductor or the like; thus, loss of electrical charge accumulated in the node due to the leakage current of the transistor 219 is negligibly-small. In other words, electrical charge accumulated in the storage capacitor 221 is not lost with the use of the transistor 219 including an oxide semiconductor in the semiconductor layer, so that it is possible to obtain a nonvolatile FF which can hold a signal without supply of power.

For example, when the off-state current of the transistor 219 at room temperature is 10 zA (1 zA (zeptoampere) is $1 \times 10^{-21}$ A) or lower and the capacitance value of the storage capacitor 221 is approximately 10 fF, data can be retained for at least $10^4$s or longer. Note that needless to say, the retention time varies depending on transistor characteristics and the capacitance value.

Since the electrical charge is stored in the floating node in this manner, even when the power of the semiconductor circuit is turned off, the nonvolatile FF 200 can retain data. Thus, at this time, the power of the semiconductor circuit is turned off.

At this time, an H-level signal is input to the control terminal of the second analog switch 213 and the second analog switch 213 is turned on, so that the first latch circuit 220 and the second latch circuit 230 are brought into conduction. However, since supply of power to the logic circuit is stopped, the data retained in the first latch circuit 220 is not input to the second latch circuit 230. Further, the data retained in the first latch circuit 220 is damaged by leakage current of the NAND circuit 215 and the third inverter circuit 205 that are included in the first latch circuit 220; thus, the data retained in the first latch circuit 220 is lost.

Then, output operation of data stored in the nonvolatile FF 200 is described.

The power of the semiconductor circuit is turned on again, and supply of power to the logic circuit in the nonvolatile FF 200 is restarted (the period a in FIG. 4B).

When power is supplied to the logic circuit, the logic circuit in the nonvolatile FF 200 starts to operate. At this time, the second control signal (OS-WE) remains at the L level; thus, the first analog switch is off and input data is not input.

Thus, data retained in the storage capacitor 221 is input to the first inverter circuit 203. Since the storage capacitor 221 retains the input data (in) even when the power is off, the data input to the first inverter circuit 203 at this time is data which is equivalent to the input data (in) stored before transition into a resting state.

The data inverted by the first inverter circuit 203 is input to the first latch circuit 220, is inverted by the NAND circuit 215 in the first latch circuit 220, and is output.

Since the second analog switch 213 is on at this time, data is output from the first latch circuit 220 to the second latch circuit 230. After the data is inverted by the second latch circuit 230, the data is inverted by the second inverter circuit 209 and is output from the output terminal of the nonvolatile FF 200.

The output data (out) output from the nonvolatile FF 200 is input data that is input to the nonvolatile FF and is inverted four times in all by the first inverter circuit 203, the first latch circuit 220, the second latch circuit 230, and the second inverter circuit 209. Thus, the output data (out) is equivalent to the input data (in) input to the nonvolatile FF 200.

The above is a method for storing input data in a nonvolatile FF, retaining the input data even when supply of power is stopped, and outputting output data which is equivalent to the input data when the power is turned on again.

Note that in this embodiment, the memory portion of the nonvolatile FF is a combination of the transistor including an oxide semiconductor in the semiconductor layer and the storage capacitor; however, a memory circuit of a nonvolatile FF in the present invention is not limited thereto. An element that serves as a nonvolatile memory, such as an electrically programmable read only memory (EPROM), an electrically erasable and programmable read only memory (EEPROM), a floating gate, a ferroelectric random access memory (FeRAM), a magnetoresistive random access memory (MRAM), a phase-change random access memory (PRAM), a resistance random access memory (ReRAM), or an atom switch, may be used.

By formation of a nonvolatile FF capable of retaining data even when supply of power is stopped in each volatile FF, it is possible to provide a semiconductor circuit whose power consumption is reduced because data transfer on transition into a resting state and data restoration on return from the resting state are completed in a short time and the transition into the resting state can be performed frequently.

With the use of the nonvolatile FF in this embodiment in the semiconductor circuit in Embodiment 1, it is possible to provide an integrated circuit which can be switched to a resting state rapidly. It is possible to provide a semiconductor circuit whose power consumption can be reduced without the decrease in operation speed by return from a resting state in a short time. It is possible to provide a method for driving the integrated circuit.

This embodiment can be combined with any of the other embodiments.

(Embodiment 3)

In this embodiment, a structure and a manufacturing method of an integrated circuit in one embodiment of the present invention are described with reference to FIGS. 5A to 5C, FIGS. 6A to 6D, FIGS. 7A to 7D, FIGS. 8A to 8D, and FIGS. 9A to 9C.

Figure 5A:
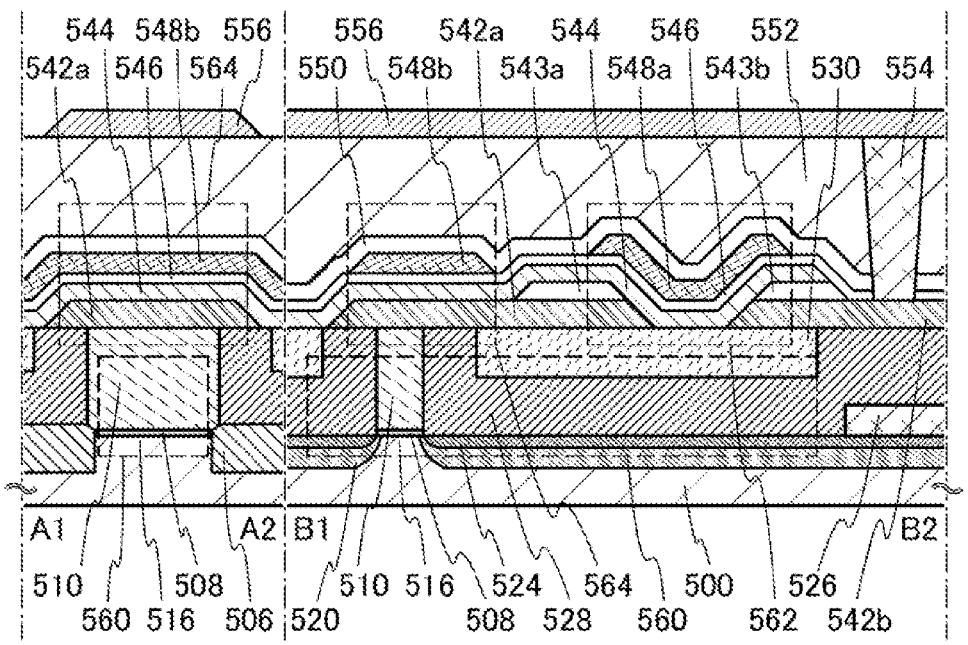
FIGS. 5A to 5C are a cross-sectional view, a top view, and a circuit diagram of a semiconductor circuit in one embodiment of the present invention.
Figure 5B:
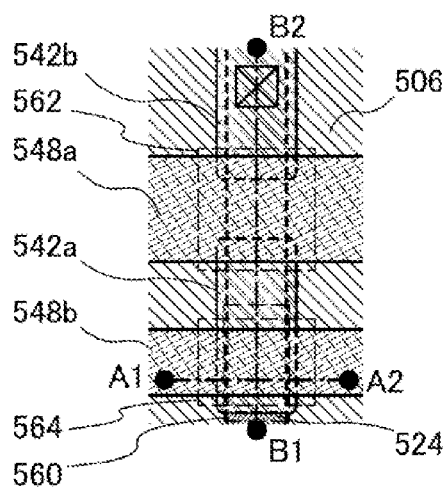
Figure 5C:
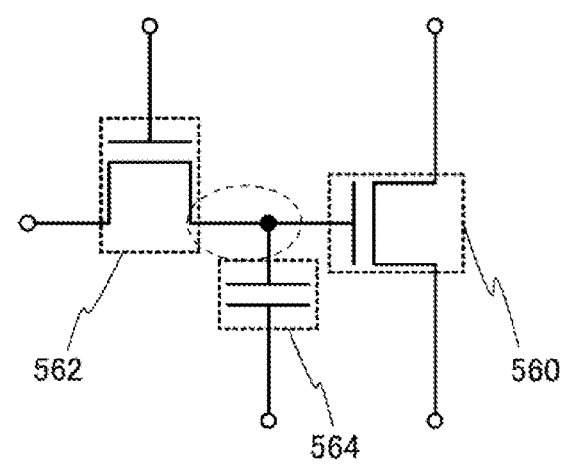

FIG. 5C illustrates the circuit structure of a semiconductor circuit in this embodiment. The semiconductor circuit in this embodiment includes a transistor 562 including an oxide semiconductor in a semiconductor layer, a transistor 560 including a material other than an oxide semiconductor in a semiconductor layer, and a storage capacitor 564. The semiconductor circuit in this embodiment is part of the integrated circuit or part of the semiconductor circuit described in Embodiments 1 and 2. For example, the transistor 562, the storage capacitor 564, and the transistor 560 can be used as the transistor 219 included in the nonvolatile FF 200, the storage capacitor 221, and the transistor included in the first inverter circuit 203 in FIG. 2, respectively.

A structure of the semiconductor circuit in FIG. 5C in which the transistor 562 including an oxide semiconductor in the semiconductor layer is stacked over the transistor 560 including silicon in the semiconductor layer and a method for forming the structure are described. With a stack of the transistors, the planar area of the circuit is reduced and the circuit can be highly integrated.

<Cross-Sectional Structure and Planar Structure of Semiconductor Device>

FIGS. 5A to 5C illustrate a structure example of the semiconductor circuit. FIG. 5A illustrates a cross section of the semiconductor circuit, and FIG. 5B illustrates a top surface of the semiconductor circuit. Here, FIG. 5A corresponds to a cross section taken along line A1-A2 and line B1-B2 in FIG. 5B. The semiconductor circuit illustrated in FIGS. 5A and 5B includes the transistor 560 including a first semiconductor material in a lower portion and the transistor 562 including a second semiconductor material in an upper portion. Here, the first semiconductor material and the second semiconductor material are preferably different from each other. For example, a material other than an oxide semiconductor that can easily operate at high speed is used as the first semiconductor material, and transistors included in arithmetic portions of a volatile FF and a nonvolatile FF are formed. When an oxide semiconductor that enables prolonged storage of electrical charge is used as the second semiconductor material, a transistor included in a memory circuit of the nonvolatile FF can be formed.

The first semiconductor material can be, for example, silicon, germanium, silicon germanium, silicon carbide, gallium arsenide, or the like, and a single crystal semiconductor is preferably used. Alternatively, an organic semiconductor material or the like may be used. In this embodiment, silicon is used.

Although all the transistors are n-channel transistors, it is needless to say that p-channel transistors can be used. The technical feature of the disclosed invention lies in the use of a semiconductor material with which off-state current can be sufficiently reduced, such as an oxide semiconductor, for the transistor 562 in order to retain data. It is therefore not necessary to limit specific conditions such as a material, a structure, and the like of the semiconductor device to those given here.

The transistor 560 in FIGS. 5A to 5C includes a channel formation region 516 provided over a semiconductor substrate 500 including a semiconductor material (e.g., silicon), impurity regions 520 with the channel formation region 516 provided therebetween, metal compound regions 524 which are in contact with the impurity regions 520, a gate insulating layer 508 provided over the channel formation region 516, and a gate electrode 510 provided over the gate insulating layer 508. Note that a transistor whose source and drain electrodes are not explicitly illustrated in a drawing might be referred to as a transistor for convenience. Further, in such a case, in description of the connection of a transistor, a source region and a source electrode might be collectively referred to as a "source electrode," and a drain region and a drain electrode might be collectively referred to as a "drain electrode". That is, in this specification, the term "source electrode" might include a source region. In addition, the term "drain electrode" might include a drain region.

An electrode 526 is connected to part of the metal compound region 524 of the transistor 560. Here, the electrode 526 serves as a source or drain electrode of the transistor 560. An element isolation insulating layer 506 is provided over the substrate 500 to surround the transistor 560. An insulating layer 528 and an insulating layer 530 are provided over the transistor 560. Note that in order to obtain high integration, the transistor 560 preferably does not have a sidewall insulating layer as illustrated in FIG. 5A. On the other hand, when the characteristics of the transistor 560 have priority, a sidewall insulating layer may be formed on a side surface of the gate electrode 510 and the impurity region 520 may include a region with a different impurity concentration in a region overlapping with the sidewall insulating layer.

The transistor 562 in FIG. 5A to 5C includes a source or drain electrode 542a and a source or drain electrode 542b provided over the insulating layer 530; an oxide semiconductor layer 544 electrically connected to the source or drain electrode 542a and the source or drain electrode 542b; a gate insulating layer 546 for covering the source or drain electrode 542a and the source or drain electrode 542b and the oxide semiconductor layer 544; a gate electrode 548a provided over the gate insulating layer 546 to overlap with the oxide semiconductor layer 544; an insulating layer 543a provided in a region between the source or drain electrode 542a and the oxide semiconductor layer 544 that overlaps with part of the gate electrode 548a; and an insulating layer 543b provided in a region between the source or drain electrode 542b and the oxide semiconductor layer 544 that overlaps with part of the gate electrode 548a. Note that in order to reduce capacitance between the source or drain electrode and the gate electrode, it is preferable to provide the insulating layer 543a and the insulating layer 543b. However, a structure without the insulating layer 543a and the insulating layer 543b can be used.

The hydrogen concentration in the oxide semiconductor layer 544 is $5 \times 10^{19}$ atoms/cm$^3$ or lower, preferably $5 \times 10^{18}$ atoms/cm$^3$ or lower, more preferably $5 \times 10^{17}$ atoms/cm$^3$ or lower. Note that the hydrogen concentration in the oxide semiconductor layer 544 is measured by secondary ion mass spectroscopy (SIMS). In the oxide semiconductor layer 544 in which the hydrogen concentration is sufficiently reduced and a defect level in an energy gap due to oxygen deficiency is reduced by sufficient supply of oxygen as described above, the carrier concentration can be easily reduced. For example, the carrier concentration is lower than $1 \times 10^{12}$/cm$^3$, preferably lower than $1 \times 10^{11}$/cm$^3$, more preferably lower than $1.45 \times 10^{10}$/cm$^3$.

Note that impurities, for example, an alkali metal such as Li or Na and an alkaline earth metal such as Ca contained in the oxide semiconductor layer are preferably reduced. Specifically, the concentration of the impurities included in the oxide semiconductor layer is preferably $2 \times 10^{16}$/cm$^3$ or lower, more preferably $1 \times 10^{15}$/cm$^3$ or lower. These metal elements have low electro-negativity and are easily bonded to oxygen in the oxide semiconductor layer; thus, a carrier path might be formed in the oxide semiconductor layer, and the oxide semiconductor layer might have lower resistance (n-type conductivity).

Although the oxide semiconductor layer 544 which is processed into an island shape is used in the transistor 562 of FIGS. 5A to 5C in order to reduce leakage current generated between elements due to miniaturization, the oxide semiconductor layer 544 is not necessarily processed into an island shape. In the case where the oxide semiconductor layer 544 is not processed into an island shape, contamination of the oxide semiconductor layer 544 due to etching in the processing can be prevented.

The storage capacitor 564 in FIGS. 5A to 5C includes the source or drain electrode 542a, the oxide semiconductor layer 544, the gate insulating layer 546, and an electrode 548b. In other words, the source or drain electrode 542a serves as one electrode of the storage capacitor 564, and the electrode 548b serves as the other electrode of the storage capacitor 564.

Note that in the storage capacitor 564 in FIGS. 5A to 5C, when the oxide semiconductor layer 544 and the gate insulating layer 546 are stacked, insulation between the source or drain electrode 542a and the electrode 548b can be sufficiently secured. Needless to say, the storage capacitor 564 without the semiconductor layer 544 may be used in order to secure sufficient capacitance. Further, the storage capacitor 564 may include an insulating layer formed in a manner similar to that of the insulating layer 543a. Alternatively, in the case where a capacitor is not needed, it is possible not to provide the storage capacitor 564.

Note that in the transistor 562 and the storage capacitor 564, end portions of the source or drain electrode 542a and the source or drain electrode 542b are preferably tapered. This is because when the end portions of the source or drain electrode 542a and the source or drain electrode 542b are tapered, coverage with the oxide semiconductor layer 544 can be improved and disconnection can be prevented. Here, a taper angle is, for example, 30 to 60°. Note that the taper angle is a tilt angle formed by a side surface and a bottom surface of a layer having a tapered shape (e.g., the source or drain electrode 542a) at the time when the layer is observed from a direction perpendicular to a cross section (a plane perpendicular to the surface of a substrate).

In this embodiment, the transistor 562 and the storage capacitor 564 are provided to overlap with the transistor 560. With such a planar layout, high integration can be obtained. For example, in the semiconductor circuit in one embodiment of the present invention, when the storage capacitor and the transistor including an oxide semiconductor which are included in the memory circuit of the nonvolatile FF overlap with the transistor included in the arithmetic portion of the volatile FF or the nonvolatile FF, a planar area can be reduced as compared to a circuit structure in which the transistor including an oxide semiconductor and the storage capacitor are placed next to the transistor included in the arithmetic portion of the volatile FF or the nonvolatile FF. Thus, an integrated circuit in one embodiment of the present invention can be highly integrated.

An insulating layer 550 is provided over the transistor 562 and the storage capacitor 564, and an insulating layer 552 is provided over the insulating layer 550. An electrode 554 is provided in an opening formed in the gate insulating layer 546, the insulating layer 550, the insulating layer 552, and the like. A wiring 556 connected to the electrode 554 is provided over the insulating layer 552. Note that the disclosed invention is not limited thereto.

<Method for Manufacturing Semiconductor Device>

Next, an example of a method for manufacturing the semiconductor device is described. First, a method for forming the transistor 560 in the lower portion is described below with reference to FIGS. 6A to 6D and FIGS. 7A to 7D. Then, a method for forming the transistor 562 in the upper portion and the storage capacitor 564 is described with reference to FIGS. 8A to 8D and FIGS. 9A to 9C.

<Method for Forming Transistor in Lower Portion>

Figure 6A:
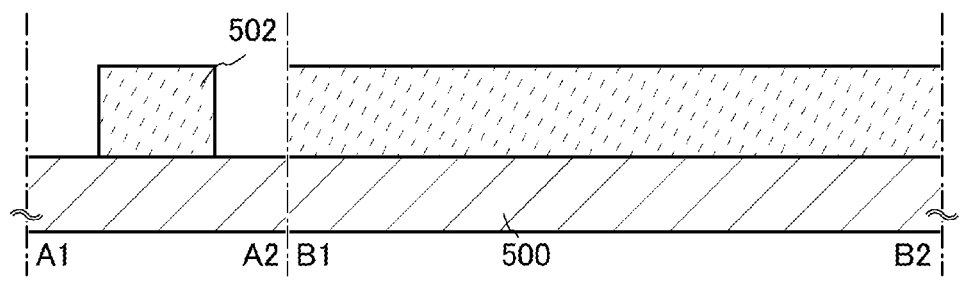
FIGS. 6A to 6D illustrate a method for forming a semiconductor circuit in one embodiment of the present invention.

First, a substrate 500 including a semiconductor material is prepared (see FIG. 6A). As the substrate 500 including a semiconductor material, a single crystal semiconductor substrate or a polycrystalline semiconductor substrate of silicon, silicon carbide, or the like; a compound semiconductor substrate of silicon germanium or the like; an SOI substrate; or the like can be used. Here, an example in which a single crystal silicon substrate is used as the substrate 500 including a semiconductor material is described. Note that although the term "SOI substrate" generally means a substrate where a silicon semiconductor layer is provided on an insulating surface, the term "SOI substrate" in this specification and the like also means a substrate where a semiconductor layer including a material other than silicon is provided on an insulating surface. That is, a semiconductor layer included in the "SOI substrate" is not limited to a silicon semiconductor layer. Further, the SOI substrate can have a structure in which a semiconductor layer is provided over an insulating substrate such as a glass substrate with an insulating layer provided therebetween.

It is particularly preferable that a single crystal semiconductor substrate of silicon or the like be used as the substrate 500 including a semiconductor material because the speed of reading operation in the semiconductor device can be increased.

A protective layer 502 serving as a mask for forming an element isolation insulating layer is formed over the substrate 500 (see FIG. 6A). As the protective layer 502, an insulating layer formed using a material such as silicon oxide, silicon nitride, or silicon oxynitride can be used, for example. Note that before or after this step, an impurity element imparting n-type conductivity or p-type conductivity may be added to the substrate 500 in order to control the threshold voltage of the transistor. When silicon is used as the semiconductor, phosphorus, arsenic, or the like can be used as the impurity imparting n-type conductivity, for example. Boron, aluminum, gallium, or the like can be used as the impurity imparting p-type conductivity, for example.

Figure 6B:
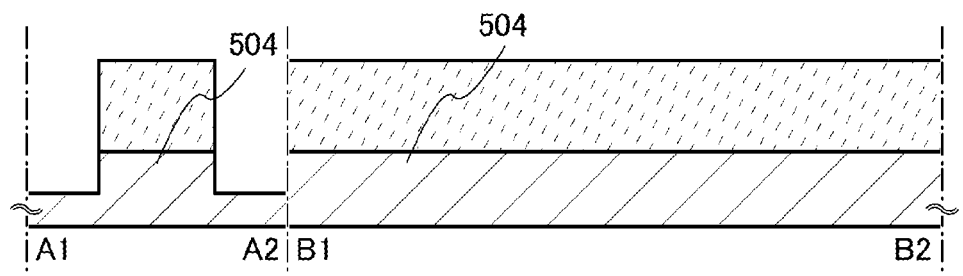

Next, part of the substrate 500 in a region which is not covered with the protective layer 502 (i.e., an exposed region) is removed by etching using the protective layer 502 as a mask (see FIG. 6B). As the etching, dry etching is preferably performed; however, wet etching may be performed. An etching gas and an etchant can be selected as appropriate depending on a material to be etched.

Then, an insulating layer is formed to cover the semiconductor region 504, and the insulating layer in a region overlapping with the semiconductor region 504 is selectively removed, so that the element isolation insulating layer 506 is formed. The insulating layer is formed using silicon oxide, silicon nitride, silicon oxynitride, or the like. As a method for removing the insulating layer, any of polishing treatment such as chemical mechanical polishing (CMP), etching, and the like can be used. Thus, the semiconductor region 504 isolated from the other semiconductor regions is formed. Note that the protective layer 502 is removed after the formation of the semiconductor region 504 or after the formation of the element isolation insulating layer 506.

Note that as a method for forming the element isolation insulating layer 506, a method in which an insulating region is formed by introduction of oxygen, or the like can be used instead of the method in which the insulating layer is selectively removed.

Next, an insulating layer is formed over a surface of the semiconductor region 504, and a layer containing a conductive material is formed over the insulating layer.

The insulating layer is to be a gate insulating layer later and can be formed, for example, by performing heat treatment (e.g., thermal oxidation treatment or thermal nitriding treatment) on a surface of the semiconductor region 504. Instead of heat treatment, high-density plasma treatment may be employed. The high-density plasma treatment can be performed using, for example, a mixed gas of a rare gas such as He, Ar, Kr, or Xe and any of oxygen, nitrogen oxide, ammonia, nitrogen, or hydrogen. Needless to say, the insulating layer may be formed by CVD, sputtering, or the like. The insulating layer preferably has a single-layer structure or a layered structure using a film including any of silicon oxide, silicon oxynitride, silicon nitride, hafnium oxide, aluminum oxide, tantalum oxide, yttrium oxide, hafnium silicate (HfSi$_x$O$_y$ (x>0, y>0)), hafnium silicate (HfSi$_x$O$_y$ (x>0, y>0)) to which nitrogen is added, hafnium aluminate (HfAl$_x$O$_y$ (x>0, y>0)) to which nitrogen is added, or the like. The thickness of the insulating layer can be, for example, 1 to 100 nm, preferably 10 to 50 nm.

The layer containing a conductive material can be formed using a metal material such as aluminum, copper, titanium, tantalum, or tungsten; an alloy material containing the metal material; or a stacked layer including the metal material or the alloy material. For example, with a structure where a metal layer containing copper is stacked over a copper-magnesium-aluminum alloy layer, adhesion can be increased. The layer containing a conductive material may be formed using a semiconductor material such as polycrystalline silicon. There is no particular limitation on the method for forming the layer containing a conductive material, and a variety of deposition methods such as vapor deposition, CVD, sputtering, or spin coating can be used. Note that in this embodiment, an example in which the layer containing a conductive material is formed using a metal material is described.

Figure 6C:
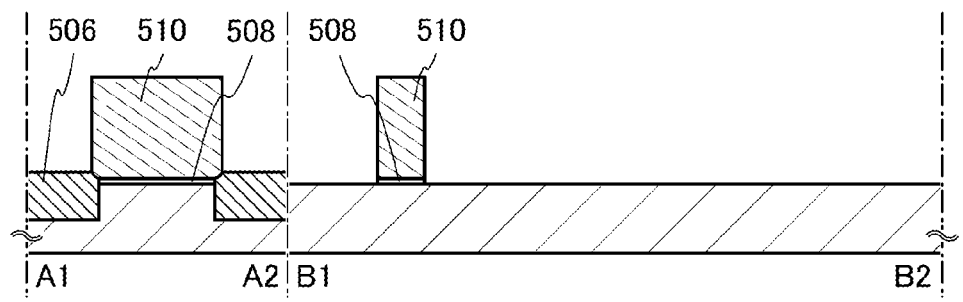

Then, the insulating layer and the layer containing a conductive material are selectively etched, so that the gate insulating layer 508 and the gate electrode 510 are formed (see FIG. 6C).

Figure 6D:
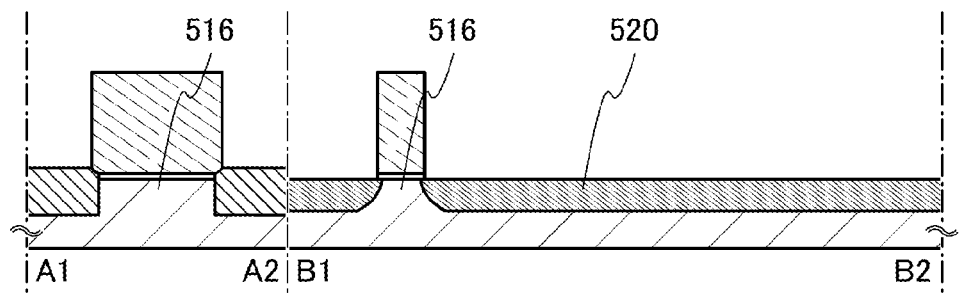

Next, phosphorus (P), arsenic (As), or the like is added to the semiconductor region 504, so that the channel formation region 516 and the impurity regions 520 are formed (see FIG. 6D). Although phosphorus or arsenic is added here in order to form an n-channel transistor, an impurity element such as boron (B) or aluminum (Al) may be added in the case where a p-channel transistor is formed. Here, the concentration of the impurity to be added can be set as appropriate; however, the concentration is preferably increased in the case where a semiconductor element is highly miniaturized.

Note that a sidewall insulating layer may be formed around the gate electrode 510 so that impurity regions to which impurity elements are added at different concentrations are formed.

Figure 7A:
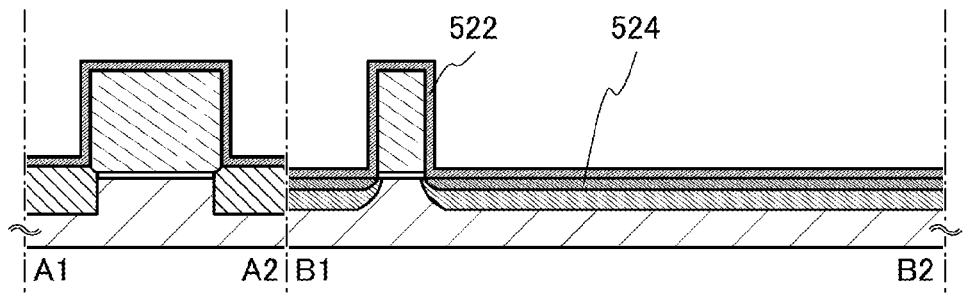
FIGS. 7A to 7D illustrate the method for forming a semiconductor circuit in one embodiment of the present invention.

Next, a metal layer 522 is formed to cover the gate electrode 510, the impurity regions 520, and the like (see FIG. 7A). The metal layer 522 can be formed by a variety of deposition methods such as vacuum vapor deposition, sputtering, or spin coating. The metal layer 522 is preferably formed using a metal material that reacts with a semiconductor material included in the semiconductor region 504 to form a low-resistance metal compound. Examples of such metal materials include titanium, tantalum, tungsten, nickel, cobalt, platinum, and the like.

Then, heat treatment is performed so that the metal layer 522 reacts with the semiconductor material. Thus, the metal compound regions 524 that are in contact with the impurity regions 520 are formed (see FIG. 7A). Note that in the case where polycrystalline silicon or the like is used for the gate electrode 510, a metal compound region is also formed in a portion of the gate electrode 510 that is in contact with the metal layer 522.

As the heat treatment, irradiation with a flash lamp can be employed, for example. Although it is needless to say that different heat treatment may be employed, a method by which heat treatment for an extremely short time can be achieved is preferably employed in order to improve the controllability of chemical reaction in formation of the metal compound. Note that the metal compound regions are formed by reaction of the metal material and the semiconductor material and have sufficiently high conductivity. The formation of the metal compound regions can sufficiently reduce the electric resistance and improve element characteristics. The metal layer 522 is removed after the formation of the metal compound regions 524.

Figure 7B:
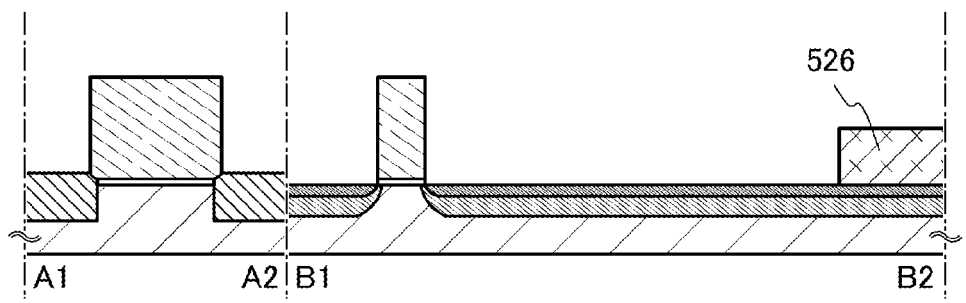

Then, the electrode 526 is formed in a region that is in contact with part of the metal compound region 524 (see FIG. 7B). For example, the electrode 526 is formed in such a manner that a layer containing a conductive material is formed and then is selectively etched. The layer containing a conductive material can be formed using a metal material such as aluminum, copper, titanium, tantalum, or tungsten; an alloy material containing the metal material; or a stacked layer of the metal material or the alloy material. For example, with a structure where a material layer containing copper is stacked over a copper-magnesium-aluminum alloy layer, adhesion can be increased. The layer containing a conductive material may be formed using a semiconductor material such as polycrystalline silicon. There is no particular limitation on the method for forming the layer containing a conductive material, and a variety of deposition methods such as vapor deposition, CVD, sputtering, or spin coating can be used.

In that case, it is possible to use a method, for example, in which a thin titanium film is formed in a region including the opening by PVD, a thin titanium nitride film is formed by CVD, and then a tungsten film is formed to fill the opening. Here, the titanium film formed by PVD has a function of reducing an oxide film (e.g., a native oxide film) formed on a surface over which the titanium film is formed and lowering the contact resistance with a lower electrode or the like (the metal compound region 524, here). The titanium nitride film formed after the formation of the titanium film has a barrier function of preventing diffusion of the conductive material. A copper film may be formed by plating after the formation of the barrier film of titanium, titanium nitride, or the like.

Figure 7C:
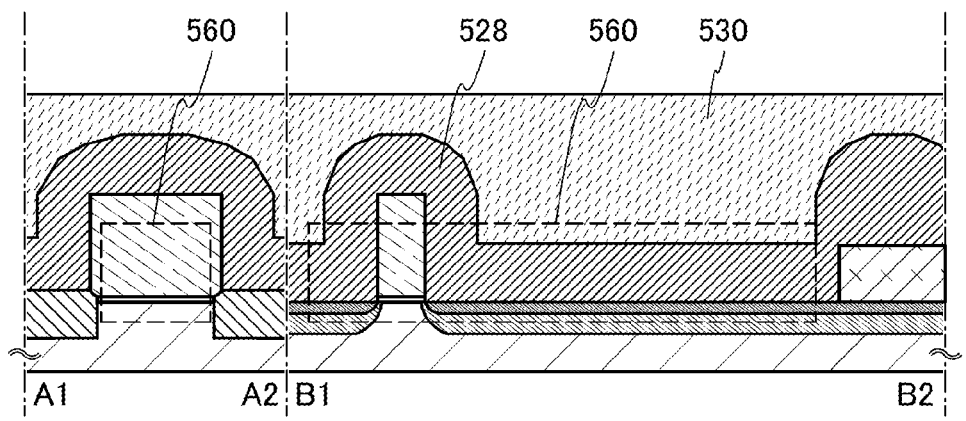

Then, the insulating layer 528 and the insulating layer 530 are formed to cover the components formed in the above steps (see FIG. 7C). The insulating layer 528 and the insulating layer 530 can be formed using a material including an inorganic insulating material such as silicon oxide, silicon oxynitride, silicon nitride, or aluminum oxide. In particular, the insulating layer 528 and the insulating layer 530 are preferably formed using a low dielectric constant (low-k) material because capacitance caused by overlap of electrodes or wirings can be sufficiently reduced. Note that a porous insulating layer including any of these materials may be used for the insulating layer 528 and the insulating layer 530. Since the porous insulating layer has lower dielectric constant than a dense insulating layer, capacitance caused by electrodes or wirings can be further reduced. Alternatively, the insulating layer 528 and the insulating layer 530 can be formed using an organic insulating material such as polyimide or acrylic. Note that although a layered structure of the insulating layer 528 and the insulating layer 530 is used here, one embodiment of the disclosed invention is not limited to this structure. A single-layer structure or a layered structure of three or more layers may be used.

Figure 7D:
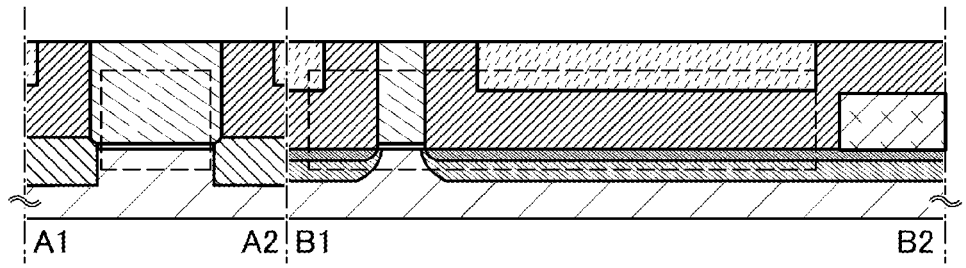

As pretreatment for the formation of the transistor 562 and the storage capacitor 564, CMP treatment is performed on the insulating layer 528 and the insulating layer 530 so that a top surface of the gate electrode 510 is exposed (see FIG. 7D). Instead of CMP treatment, etching or the like can be used as the treatment for exposing the top surface of the gate electrode 510, and it is preferable that surfaces of the insulating layer 528 and the insulating layer 530 be as flat as possible in order that characteristics of the transistor 562 be improved.

Through the above steps, the transistor 560 using the substrate 500 including a semiconductor material is formed. The transistor 560 can operate at high speed. Thus, when the transistor is used as a transistor in a volatile FF, the normal operation of a semiconductor circuit can be performed at high speed.

Note that before or after the steps, a step of forming an electrode, a wiring, a semiconductor layer, an insulating layer, or the like may be further performed. For example, a multilayer wiring structure in which an insulating layer and a conductive layer are stacked is employed as a wiring structure, so that a highly-integrated semiconductor device can be obtained.

<Method for Forming Transistor in Upper Portion>

Figure 8A:
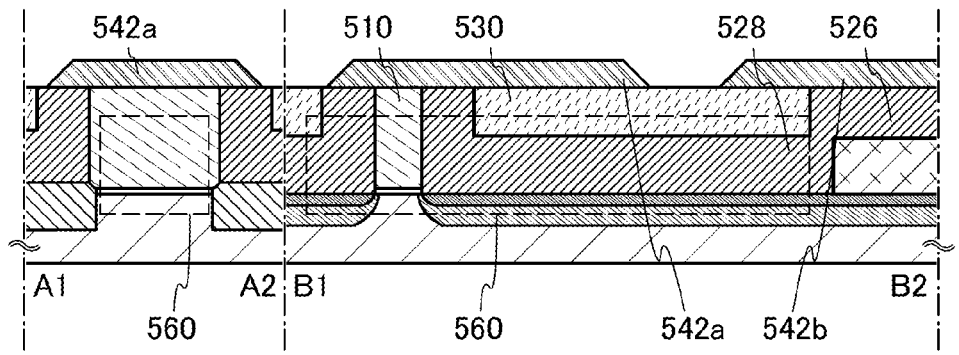
FIGS. 8A to 8D illustrate the method for forming a semiconductor circuit in one embodiment of the present invention.

Next, a conductive layer is formed over the gate electrode 510, the insulating layer 528, the insulating layer 530, and the like and is selectively etched, so that the source and drain electrodes 542a and 542b are formed (see FIG. 8A).

The conductive layer can be formed by PVD such as sputtering or CVD such as plasma-enhanced CVD. As the material of the conductive layer, an element selected from aluminum, chromium, copper, tantalum, titanium, molybdenum, or tungsten; an alloy containing any of these elements as a component; or the like can be used. One or more materials selected from manganese, magnesium, zirconium, beryllium, neodymium, or scandium may be used.

The conductive layer may have a single-layer structure or a layered structure of two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked. Note that in the case where the conductive layer has a single-layer structure of a titanium film or a titanium nitride film, there is an advantage that the conductive layer is easily processed into the source and drain electrodes 542a and 542b having tapered shapes.

Alternatively, the conductive layer may be formed using a conductive metal oxide. As the conductive metal oxide, indium oxide (In$_2$O$_3$), tin oxide (SnO$_2$), zinc oxide (ZnO), indium tin oxide (In$_2$O$_3$—SnO$_2$, which is abbreviated to ITO in some cases), indium zinc oxide (In$_2$O$_3$—ZnO), or any of these metal oxide materials in which silicon or silicon oxide is included can be used.

The conductive layer is preferably etched so that end portions of the source and drain electrodes 542a and 542b are tapered. Here, it is preferable that a taper angle be 30 to 60°, for example. Etching is performed so that the end portions of the source and drain electrodes 542a and 542b are tapered. Thus, coverage with the gate insulating layer 546 formed later can be improved and disconnection can be prevented.

The channel length (L) of the transistor in the upper portion is determined by a distance between lower end portions of the source or drain electrode 542a and the source or drain electrode 542b. Note that for exposure for forming a mask used at the time when a transistor with a channel length (L) of less than 25 nm is formed, it is preferable to use extreme ultraviolet rays whose wavelength is as short as several nanometers to several tens of nanometers. In the exposure by extreme ultraviolet rays, the resolution is high and the focus depth is large. Accordingly, the channel length (L) of the transistor to be formed later can be 10 nm to 1000 nm (1 μm), and the circuit can operate at higher speed. Further, the power consumption of the semiconductor device can be reduced by miniaturization.

Note that an insulating layer serving as a base may be formed over the insulating layer 528 and the insulating layer 530. The insulating layer can be formed by PVD, CVD, or the like.

Figure 8B:
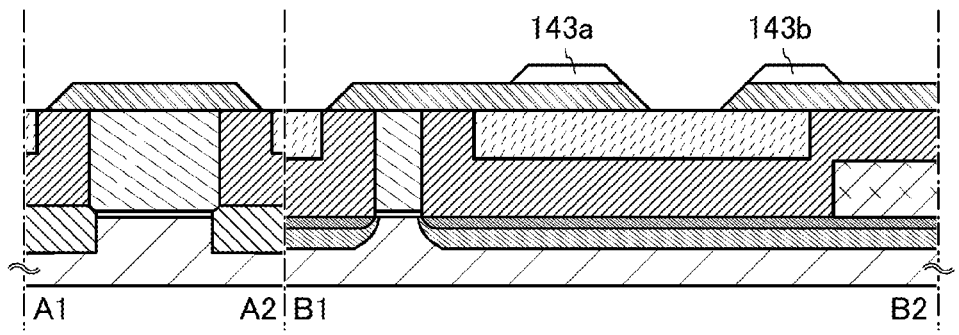

Then, the insulating layer 543a and the insulating layer 543b are formed over the source or drain electrode 542a and the source or drain electrode 542b, respectively (see FIG. 8B). The insulating layer 543a and the insulating layer 543b can be formed in such a manner that an insulating layer covering the source or drain electrode 542a and the source or drain electrode 542b is formed and then is selectively etched. The insulating layer 543a and the insulating layer 543b are formed to overlap with part of a gate electrode formed later. By provision of such an insulating layer, capacitance between the gate electrode and the source or drain electrode can be reduced.

The insulating layer 543a and the insulating layer 543b can be formed using a material including an inorganic insulating material such as silicon oxide, silicon oxynitride, silicon nitride, or aluminum oxide. In particular, the insulating layer 543a and the insulating layer 543b are preferably formed using a low dielectric constant (low-k) material because capacitance between the gate electrode and the source or drain electrode can be sufficiently reduced. Note that a porous insulating layer including any of these materials may be used for the insulating layer 543a and the insulating layer 543b. Since the porous insulating layer has a lower dielectric constant than a dense insulating layer, capacitance between the gate electrode and the source or drain electrode can be further reduced.

Note that in order to reduce the capacitance between the gate electrode and the source or drain electrode, the insulating layer 543a and the insulating layer 543b are preferably formed; however, a structure without the insulating layer 543a and the insulating layer 543b may be employed.

Figure 8C:
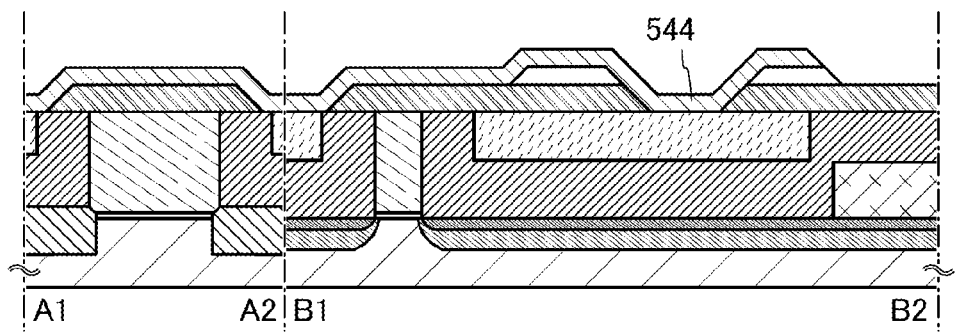
Figure 8D:
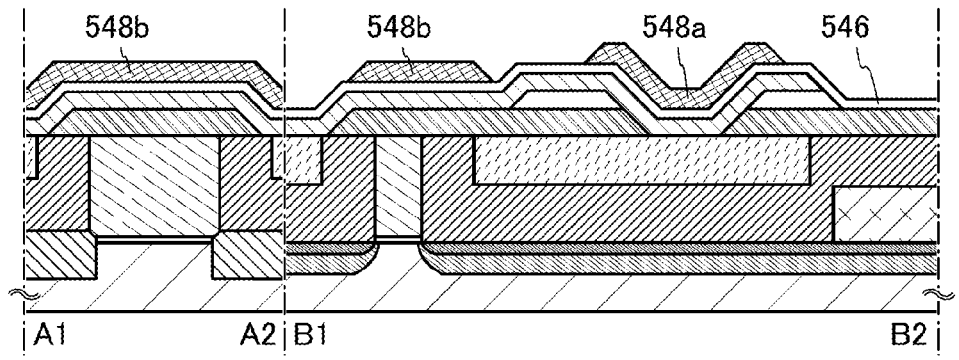

Next, after an oxide semiconductor layer is formed to cover the source or drain electrode 542a and the source or drain electrode 542b, the oxide semiconductor layer is selectively etched, so that the oxide semiconductor layer 544 is formed (see FIG. 8C).

As an oxide semiconductor used for the oxide semiconductor layer, a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; an In—O-based oxide semiconductor; a Sn—O-based oxide semiconductor; a Zn—O-based oxide semiconductor; or the like can be used. Further, the oxide semiconductor layer may contain silicon oxide. When silicon oxide (SiO$_X$ (X>0)), which hinders crystallization, is contained in the oxide semiconductor layer, crystallization of the oxide semiconductor layer can be suppressed in the case where heat treatment is performed after the oxide semiconductor layer is formed in the manufacturing process. Note that the oxide semiconductor layer is preferably amorphous but may be partly crystallized. Here, for example, an In—Ga—Zn—O-based oxide semiconductor means an oxide film containing indium (In), gallium (Ga), and zinc (Zn), and there is no particular limitation on the composition ratio. Further, the In—Ga—Zn—O-based oxide semiconductor may contain an element other than In, Ga, and Zn.

For the oxide semiconductor layer 544, a thin film represented by a chemical formula of InMO$_3$(ZnO)$_m$ (m>0, where m is not a natural number) can be used. Here, M denotes one or more metal elements selected from Ga, Al, Mn, or Co. For example, M can be Ga, Ga and Al, Ga and Mn, Ga and Co, or the like. As the oxide semiconductor, a material represented by In$_2$SnO$_5$(ZnO)$_n$ (n>0, where n is a natural number) may be used.

The oxide semiconductor is preferably an oxide semiconductor containing In, more preferably, an oxide semiconductor containing In and Ga. In this embodiment, an amorphous oxide semiconductor layer is formed by sputtering using an In—Ga—Zn—O-based metal oxide target.

As a target used for formation of the oxide semiconductor layer 544 by sputtering, foe example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide whose composition is in the neighborhood of the above composition can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

Note that for example, the expression "the composition of an oxide with an atomic ratio of In:Ga:Zn=a:b:c (a+b+c=1) is in the neighborhood of the composition of an oxide with an atomic ratio of In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

In the case where an In—Zn—O-based material is used for the oxide semiconductor, a target used has a composition ratio of In:Zn=50:1 to 1:2 in an atomic ratio (In$_2$O$_3$:ZnO=25:1 to 1:4 in a molar ratio), preferably In:Zn=20:1 to 1:1 in an atomic ratio (In$_2$O$_3$:ZnO=10:1 to 1:2 in a molar ratio), more preferably In:Zn=1.5:1 to 15:1 in an atomic ratio (In$_2$O$_3$:ZnO=3:4 to 15:2 in a molar ratio). For example, when a target used for deposition of an In—Zn—O-based oxide semiconductor has a composition ratio of In:Zn:O=X:Y:Z in an atomic ratio, where Z>1.5X+Y.

It is preferable that a metal oxide contained in the metal oxide target have a relative density of 80% or higher, preferably 95% or higher, more preferably 99.9% or higher. The use of a metal oxide target having high relative density makes it possible to form the oxide semiconductor layer with a dense structure. Further, the purity of the target is preferably 99.99% or higher, where it is preferable that impurities, for example, an alkali metal such as Na or Li and an alkaline earth metal such as Ca be particularly reduced.

The atmosphere in which the oxide semiconductor layer is formed is preferably a rare gas (typically, argon) atmosphere, an oxygen atmosphere, or a mixed atmosphere containing a rare gas (typically, argon) and oxygen. Specifically, it is preferable to use, for example, the atmosphere of a high-purity gas from which an impurity such as hydrogen, water, a hydroxyl group, or hydride is removed so that the impurity concentration is 1 ppm or lower (preferably, the impurity concentration is 10 ppb or lower). Specifically, a high-purity gas with a dew point of −60° C. or lower is preferable.

In the formation of the oxide semiconductor layer, for example, an object is held in a treatment chamber that is kept under reduced pressure and is heated so that the temperature of the object is higher than or equal to 100° C. and lower than 550° C., preferably higher than or equal to 200° C. and lower than or equal to 400° C. Alternatively, the temperature of the object in the formation of the oxide semiconductor layer may be room temperature (25° C.±10° C.). Then, a sputtering gas from which hydrogen, water, or the like is removed is introduced while moisture in the treatment chamber is removed, and the target is used, whereby the oxide semiconductor layer is formed. The oxide semiconductor layer is formed while the object is heated, so that impurities contained in the oxide semiconductor layer can be reduced. Further, damage due to sputtering can be reduced. In order to remove moisture in the treatment chamber, an adsorption vacuum pump is preferably used. For example, a cryopump, an ion pump, a titanium sublimation pump, or the like can be used. Alternatively, a turbo pump provided with a cold trap may be used. By evacuation with the cryopump or the like, hydrogen, water, and the like can be removed from the treatment chamber, so that the impurity concentration in the oxide semiconductor layer can be reduced.

Further, when the leakage rate of the treatment chamber of the sputtering apparatus is set lower than or equal to $1×10^{-10}$ Pa·m$^3$/s, entry of impurities such as an alkali metal or hydride into the oxide semiconductor film that is being formed by sputtering can be reduced. Furthermore, with the use of an adsorption vacuum pump as an evacuation system, counter flow of an alkali metal, a hydrogen atom, a hydrogen molecule, water, a hydroxyl group, hydride, or the like from the evacuation system can be reduced.

The oxide semiconductor layer can be formed under the following conditions, for example: the distance between the object and the target is 170 mm, the pressure is 0.4 Pa, the direct-current (DC) power is 0.5 kW, and the atmosphere is an oxygen atmosphere (the proportion of oxygen is 100%), an argon atmosphere (the proportion of argon is 100%), or a mixed atmosphere including oxygen and argon.

Note that a pulse-direct current (DC) power source is preferably used because dust (e.g., powdery substances generated in the deposition) can be reduced and the film thickness can be uniform. The thickness of the oxide semiconductor layer is 1 to 50 nm, preferably 1 to 30 nm, more preferably 1 to 10 nm. With the oxide semiconductor layer having such thickness, a short-channel effect due to miniaturization can be suppressed. Note that the appropriate thickness differs depending on the oxide semiconductor material to be used, the use of the semiconductor device, and the like; thus, the thickness can be determined in accordance with the material, the use, and the like.

Note that before the oxide semiconductor layer is formed by sputtering, a substance attached to a surface where the oxide semiconductor layer is to be formed (e.g., a surface of the insulating layer 530) is preferably removed by reverse sputtering in which an argon gas is introduced and plasma is generated. Here, the reverse sputtering is a method in which ions collide with a process surface of a substrate so that the surface is modified, in contrast to normal sputtering in which ions collide with a sputtering target. As an example of a method for making ions collide with a process surface, there is a method in which high-frequency voltage is input to the process surface in an argon atmosphere so that plasma is generated in the vicinity of an object. Note that the atmosphere of nitrogen, helium, oxygen, or the like may be used instead of an argon atmosphere.

After that, heat treatment (first heat treatment) is preferably performed on the oxide semiconductor layer. By the first heat treatment, excessive hydrogen (including water and a hydroxyl group) in the oxide semiconductor layer is removed and the structure of the oxide semiconductor layer is improved, so that the defect level in an energy gap can be reduced. The temperature of the first heat treatment is, for example, higher than or equal to 150° C. and lower than 650° C., preferably higher than or equal to 200° C. and lower than or equal to 500° C.

The heat treatment can be performed in such a manner that, for example, an object is introduced into an electric furnace in which a resistance heater or the like is used at 450° C. for 1 h in a nitrogen atmosphere. The oxide semiconductor layer is not exposed to the air during the heat treatment so that entry of water or hydrogen can be prevented.

The heat treatment apparatus is not limited to an electric furnace. The heat treatment apparatus can be an apparatus that heats an object by thermal conduction or thermal radiation from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the gas, an inert gas which does not react with an object by heat treatment, such as nitrogen or a rare gas such as argon, is used.

For example, as the first heat treatment, GRTA treatment may be performed in the following manner. The object is put in an inert gas atmosphere that has been heated, heated for several minutes, and then taken out of the inert gas atmosphere. The GRTA treatment enables high-temperature heat treatment in a short time. Further, in the GRTA treatment, even conditions of the temperature that exceeds the upper temperature limit of the object can be employed. Note that the inert gas may be changed to a gas including oxygen during the process. This is because defect levels in the energy gap due to oxygen deficiency can be reduced by the first heat treatment in an atmosphere including oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is set to 6N (99.9999%) or more, preferably 7N (99.99999%) or more (i.e., the impurity concentration is 1 ppm or lower, preferably 0.1 ppm or lower).

The heat treatment (the first heat treatment) has an effect of removing hydrogen, water, and the like and thus can be referred to as dehydration treatment, dehydrogenation treatment, or the like. The dehydration treatment or the dehydrogenation treatment can be performed, for example, after the oxide semiconductor layer is formed, after the gate insulating layer is formed, or after the gate electrode is formed. Such dehydration treatment or dehydrogenation treatment may be performed once or more than once.

The oxide semiconductor layer may be etched before or after the heat treatment. In terms of miniaturization of elements, dry etching is preferably used; however, wet etching may be used. An etching gas and an etchant can be selected as appropriate depending on a material to be etched. Note that in the case where leakage in an element does not cause a problem, the oxide semiconductor layer may be used without being processed to have an island shape.

In addition, as the oxide semiconductor layer, an oxide semiconductor layer having a crystal region which is c-axis-aligned perpendicularly to a surface may be formed by performing deposition twice and heat treatment twice, regardless of the material of a base member, such as an oxide, a nitride, or a metal. For example, after a first oxide semiconductor film with a thickness of 3 to 15 nm is deposited, first heat treatment is performed at 450 to 850° C., preferably 550 to 750° C. in the atmosphere of nitrogen, oxygen, a rare gas, a mixed gas of oxygen and a rare gas, a mixed gas of nitrogen and a rare gas, a mixed gas of nitrogen and oxygen, or dry air, so that a first oxide semiconductor film which includes a crystalline region (including plate-like crystals) in a region including its surface is formed. Then, after a second oxide semiconductor film which has larger thickness than the first oxide semiconductor film is formed, second heat treatment is performed at 450 to 850° C., preferably 600 to 700° C., so that crystal growth proceeds upward with the use of the first oxide semiconductor film as a seed of the crystal growth and the entire second oxide semiconductor film is crystallized. In such a manner, the oxide semiconductor layer having a thick crystal region may be formed.

Further, an oxide semiconductor layer having a crystal region which is c-axis-aligned perpendicularly to a surface of the film may be formed by forming an oxide semiconductor layer while the substrate is heated to a temperature at which the oxide semiconductor is c-axis aligned. With such deposition, the number of processes can be reduced. The temperature for heating the substrate is preferably 150 to 450° C. Note that the temperature may be set as appropriate in accordance with other deposition conditions which differ depending on a deposition apparatus; for example, when the deposition is performed with a sputtering apparatus, the substrate temperature may be 250° C. or higher.

Next, the gate insulating layer 546 which is in contact with the oxide semiconductor layer 544 is formed. After that, over the gate insulating layer 546, the gate electrode 548a is formed in a region overlapping with the oxide semiconductor layer 544, and the electrode 548b is formed in a region overlapping with the source or drain electrode 542a (see FIG. 8D).

The gate insulating layer 546 can be formed by CVD, sputtering, or the like. The gate insulating layer 546 is preferably formed to contain silicon oxide, silicon nitride, silicon oxynitride, aluminum oxide, tantalum oxide, hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. The gate insulating layer 546 may have a single-layer structure or a layered structure. There is no particular limitation on the thickness of the gate insulating layer 546; however, in the case where a semiconductor device is miniaturized, the thickness is preferably small in order to secure the operation of the transistor. For example, in the case where silicon oxide is used, the thickness can be 1 to 100 nm, preferably 10 to 50 nm.

When the gate insulating layer is thin as described above, gate leakage due to a tunneling effect or the like becomes problematic. In order to solve the problem of gate leakage, it is preferable that the gate insulating layer 546 be formed using a high dielectric constant (high-k) material such as hafnium oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, or hafnium aluminate ($HfAl_xO_y$ (x>0, y>0)) to which nitrogen is added. By using a high-k material for the gate insulating layer 546, electrical characteristics can be secured and the thickness can be increased in order to prevent gate leakage. Note that a layered structure of a film containing a high-k material and a film containing any of silicon oxide, silicon nitride, silicon oxynitride, silicon nitride oxide, aluminum oxide, or the like may be employed.

After the gate insulating layer 546 is formed, second heat treatment is preferably performed in an inert gas atmosphere or an oxygen atmosphere. The temperature of the heat treatment is 200 to 450° C., preferably 250 to 350° C. For example, the heat treatment may be performed at 250° C. for 1 h in a nitrogen atmosphere. The second heat treatment can reduce variations in electrical characteristics of the transistor. Further, in the case where the gate insulating layer 546 includes oxygen, oxygen can be supplied to the oxide semiconductor layer 544, and oxygen vacancies in the oxide semiconductor layer 544 can be filled.

Note that in this embodiment, the second heat treatment is performed after the gate insulating layer 546 is formed; however, the timing of the second heat treatment is not limited to thereto. For example, the second heat treatment may be performed after the gate electrode is formed. Alternatively, the first heat treatment and the second heat treatment may be performed successively, the first heat treatment may serve as the second heat treatment, or the second heat treatment may serve as the first heat treatment.

At least one of the first heat treatment and the second heat treatment is performed as described above, whereby the oxide semiconductor layer 544 can be highly purified to contain impurities other than main components as little as possible.

The gate electrode 548a and the electrode 548b can be formed in such a manner that a conductive layer is formed over the gate insulating layer 546 and then is selectively etched. The conductive layer to be the gate electrode 548a and the electrode 548b can be formed by PVD such as sputtering or CVD such as plasma-enhanced CVD. The details are similar to those of the source or drain electrode 542a or the like; thus, description thereof can be referred to.

Figure 9A:
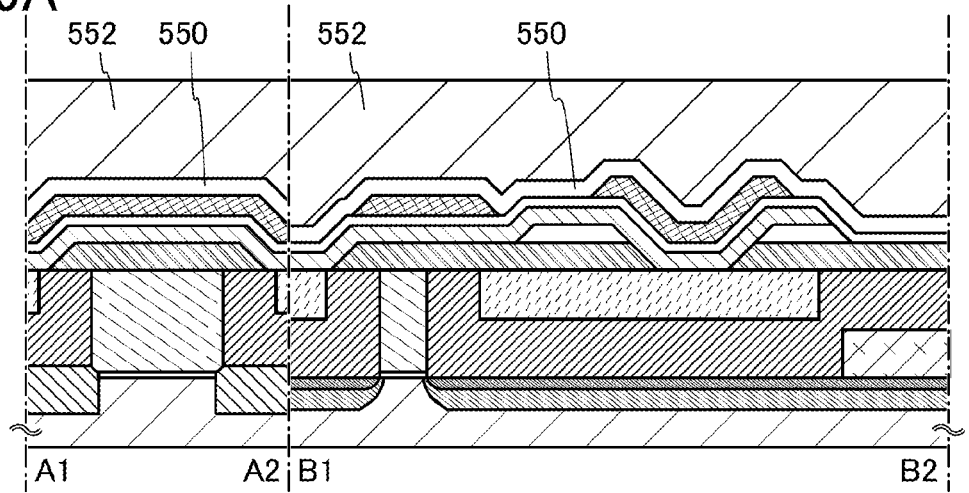
FIGS. 9A to 9C illustrate the method for forming a semiconductor circuit in one embodiment of the present invention.

Then, the insulating layer 550 and the insulating layer 552 are formed over the gate insulating layer 546, the gate electrode 548a, and the electrode 548b (see FIG. 9A). The insulating layer 550 and the insulating layer 552 can be formed by PVD, CVD, or the like. The insulating layer 550 and the insulating layer 552 can be formed using a material including an inorganic insulating material such as silicon oxide, silicon oxynitride, silicon nitride, hafnium oxide, or aluminum oxide.

Note that for the insulating layer 550 and the insulating layer 552, a material with a low dielectric constant or a structure with a low dielectric constant (e.g., a porous structure) is preferably used. When the insulating layer 550 and the insulating layer 552 have a low dielectric constant, capacitance generated between wirings or electrodes can be reduced, which results in higher speed operation.

Note that although a layered structure of the insulating layer 550 and the insulating layer 552 is used here, one embodiment of the disclosed invention is not limited to this structure. A single-layer structure or a layered structure of three or more layers may be used. Alternatively, it is possible not to provide an insulating layer.

Note that the insulating layer 552 is preferably formed to have a flat surface. This is because when the insulating layer 552 has a flat surface, an electrode, a wiring, or the like can be favorably formed over the insulating layer 552 even in the case where the semiconductor device is miniaturized, for example. The insulating layer 552 can be flattened by a method such as chemical mechanical polishing (CMP).

Figure 9B:
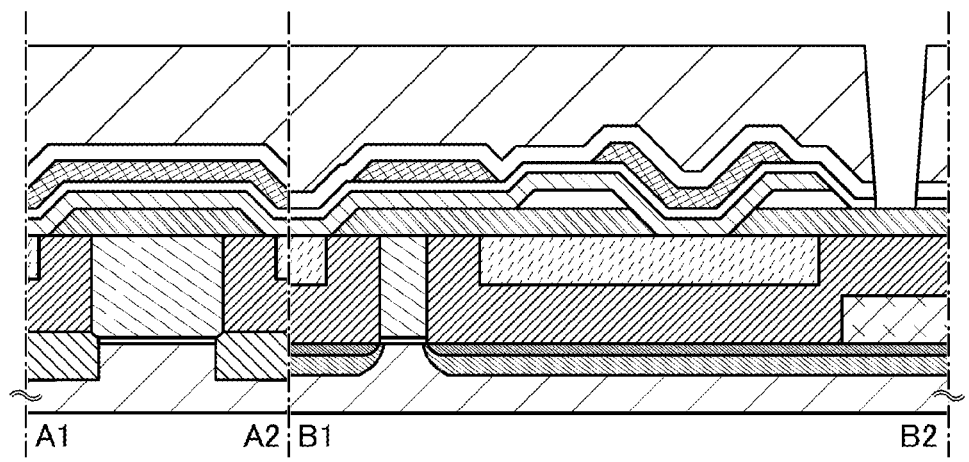

Next, an opening reaching the source or drain electrode 542b is formed in the gate insulating layer 546, the insulating layer 550, and the insulating layer 552 (see FIG. 9B). The opening is formed by selective etching with the use of a mask or the like.

Figure 9C:
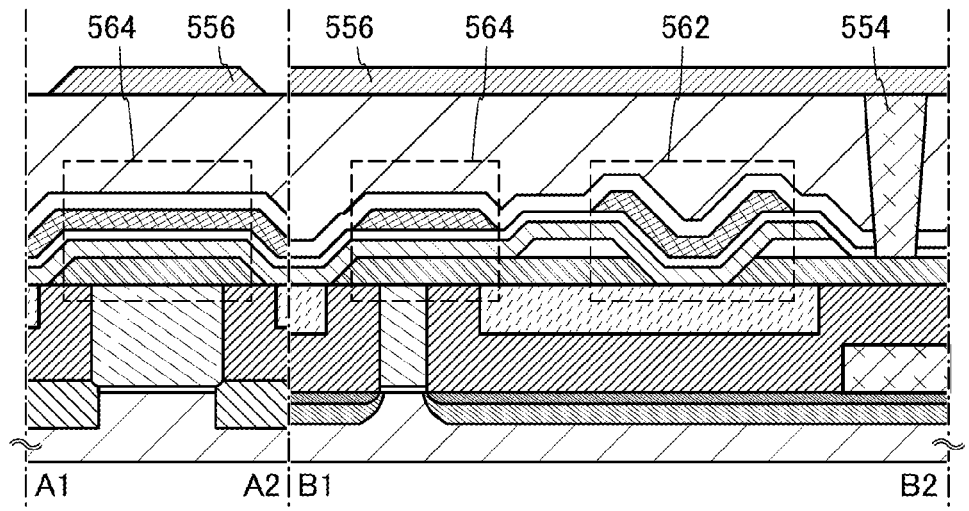

Then, the electrode 554 is formed in the opening, and the wiring 556 that is in contact with the electrode 554 is formed over the insulating layer 552 (see FIG. 9C).

The electrode 554 can be formed in such a manner that, for example, a conductive layer is formed by PVD, CVD, or the like in a region including the opening and then part of the conductive layer is removed by a method such as etching or CMP.

Specifically, for example, it is possible to use a method, for example, in which a thin titanium film is formed in a region including the opening by PVD, a thin titanium nitride film is formed by CVD, and then a tungsten film is formed to fill the opening. Here, the titanium film formed by PVD has a function of reducing an oxide film (e.g., a native oxide film) formed on a surface over which the titanium film is formed and lowering the contact resistance with a lower electrode or the like (the source or drain electrode 542b, here). The titanium nitride film formed after the formation of the titanium film has a barrier function of preventing diffusion of the conductive material. A copper film may be formed by plating after the formation of the barrier film of titanium, titanium nitride, or the like.

Note that in the case where the electrode 554 is formed by removal of part of the conductive layer, processing is preferably performed so that a surface of the electrode 554 is flat. For example, when a thin titanium film or a thin titanium nitride film is formed in a region including the opening and then a tungsten film is formed to be embedded in the opening, excess tungsten, titanium, titanium nitride, or the like can be removed and the flatness of the surface of the electrode 554 can be improved by subsequent CMP treatment. Further, such treatment for improving the flatness can flatten the entire surface including the surface of the electrode 554. The entire surface including the surface of the electrode 554 is flattened in this manner, so that an electrode, a wiring, an insulating layer, a semiconductor layer, or the like can be favorably formed in a later step.

The wiring 556 can be formed in such a manner that a conductive layer is formed by PVD such as sputtering or CVD such as plasma-enhanced CVD and then is patterned. As the material of the conductive layer, an element selected from aluminum, chromium, copper, tantalum, titanium, molybdenum, or tungsten; an alloy containing any of these elements as a component; or the like can be used. One or more materials selected from manganese, magnesium, zirconium, beryllium, neodymium, or scandium may be used. The details are similar to those of the source or drain electrode 542a or the like.

Through the above steps, the transistor 562 including the oxide semiconductor layer 544 and the storage capacitor 564 are completed (see FIG. 9C).

In the transistor 562 in this embodiment, the hydrogen concentration in the oxide semiconductor layer 544 is $5 \times 10^{19}$ atoms/cm$^3$ or lower, preferably $5 \times 10^{18}$ atoms/cm$^3$ or lower, more preferably $5 \times 10^{17}$ atoms/cm$^3$ or lower. In addition, the carrier density of the oxide semiconductor layer 544 is much lower (e.g., lower than $1 \times 10^{12}$/cm$^3$, preferably lower than $1.45 \times 10^{10}$/cm$^3$) than that of a general silicon wafer (approximately $1 \times 10^{14}$/cm$^3$). The off-state current (current per unit channel width (1 μm), here) of the transistor 562 at room temperature (25° C.) is 100 zA (1 zA (zeptoampere) is $1 \times 10^{-21}$ A) or less, preferably 10 zA or less.

With the use of such a transistor, it is possible to obtain a semiconductor circuit in which off-state current is reduced and a signal can be held without supply of power.

When a transistor including an oxide semiconductor in a semiconductor layer and a transistor including a material other than an oxide semiconductor are formed to overlap with each other, the increase in circuit area can be suppressed and the circuit can be more highly integrated. In addition, in the semiconductor circuit in this embodiment, a wiring can be shared; thus, a semiconductor circuit with sufficiently high integration degree can be obtained.

When the circuit structure described in this embodiment is used in the nonvolatile FF described in Embodiment 2, a storage capacitor and a transistor including an oxide semiconductor in a semiconductor layer can be stacked over a transistor including a different semiconductor material in a semiconductor layer; thus, the nonvolatile FF can be highly integrated.

Similarly, a transistor including a different semiconductor material in a semiconductor layer and a transistor including an oxide semiconductor material that are included in a volatile FF can be stacked, or the nonvolatile FF and the volatile FF can be stacked. Thus, even when a nonvolatile FF is provided for each volatile FF, an integrated circuit can be manufactured without the increase in circuit area.

When a layered structure is employed in the semiconductor circuit, the nonvolatile flip-flop, or part of the circuit described in Embodiment 1 or 2 as in this embodiment, a nonvolatile FF can be provided in a volatile FF without the increase in circuit area. Thus, it is possible to highly integrate an integrated circuit which can be switched to a resting state rapidly.

As described above, the structures, methods, and the like described in this embodiment can be combined with any of the structures, methods, and the like described in the other embodiments as appropriate.

(Embodiment 4)

In this embodiment, semiconductor devices each including the integrated circuit in the above embodiment are described with reference to FIGS. 10A to 10F. In this embodiment, applications of the integrated circuit to semiconductor devices such as a computer, a cellular phone set (also referred to as a cellular phone or a cellular phone device), a personal digital assistant (including a portable game machine, an audio reproducing device, and the like), a camera such as a digital camera or a digital video camera, electronic paper, and a television set (also referred to as a television or a television receiver) are described.

Figure 10A:
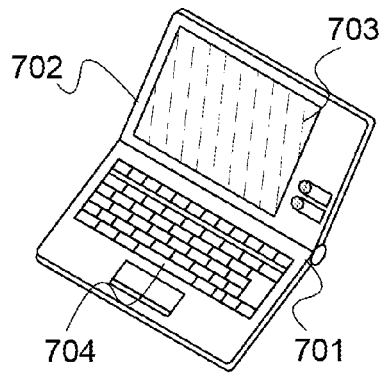
FIGS. 10A to 10F illustrate semiconductor devices in one embodiment of the present invention.

FIG. 10A illustrates a laptop, which includes a housing 701, a housing 702, a display portion 703, a keyboard 704, and the like. The integrated circuit in the above embodiment is provided in at least one of the housing 701 and the housing 702. Thus, a laptop in which data is written and read at high speed and power consumption is sufficiently reduced can be obtained.

Figure 10D:
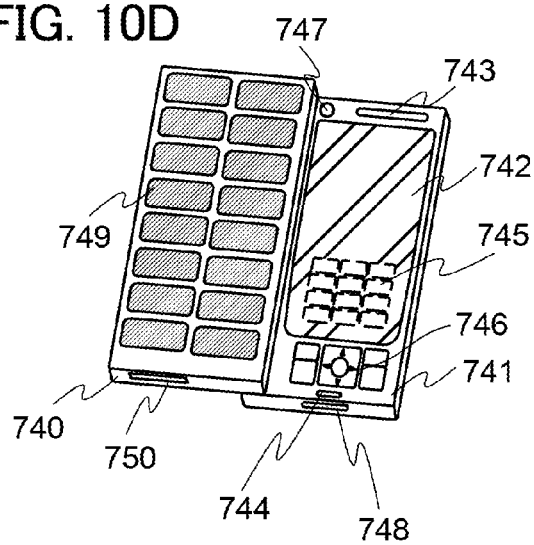
Figure 10B:
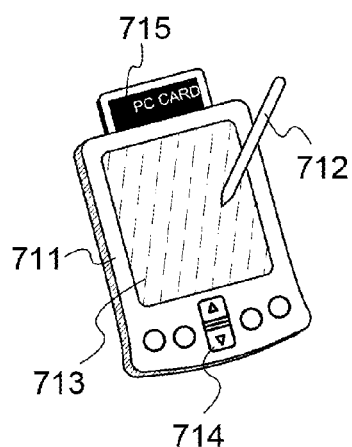

FIG. 10B illustrates a personal digital assistant (PDA). A main body 711 is provided with a display portion 713, an external interface 715, operation buttons 714, and the like. Further, a stylus 712 and the like for operation of the personal digital assistant are provided. In the main body 711, the integrated circuit in the above embodiment is provided. Thus, a personal digital assistant in which data is written and read at high speed and power consumption is sufficiently reduced can be obtained.

Figure 10E:
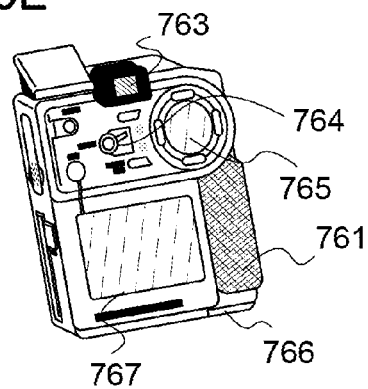
Figure 10C:
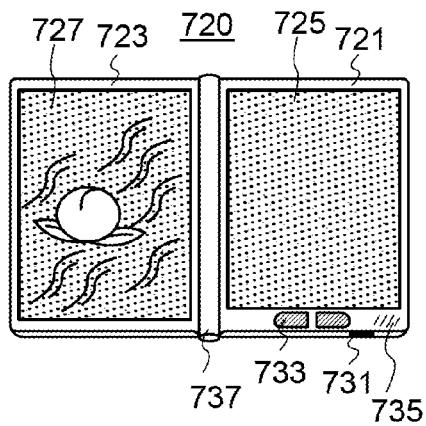

FIG. 10C illustrates an e-book reader 720 provided with electronic paper. The e-book reader 720 includes two housings 721 and 723. The housing 721 and the housing 723 include a display portion 725 and a display portion 727, respectively. The housings 721 and 723 are connected to each other by a hinge 737 and can be opened or closed with the hinge 737 used as an axis. The housing 721 is provided with a power switch 731, operation keys 733, a speaker 735, and the like. At least one of the housings 721 and 723 is provided with the integrated circuit in the above embodiment. Thus, an e-book reader in which data is written and read at high speed and power consumption is sufficiently reduced can be obtained.

FIG. 10D illustrates a cellular phone set, which includes two housings 740 and 741. Further, the housing 740 and the housing 741 which are developed as illustrated in FIG. 10D can overlap with each other by sliding; thus, the size of the cellular phone set can be decreased, which makes the cellular phone set suitable for being carried. The housing 741 includes a display panel 742, a speaker 743, a microphone 744, operation keys 745, a pointing device 746, a camera lens 747, an external connection terminal 748, and the like. The housing 740 includes a solar cell 749 for storing electricity in the cellular phone set, an external memory slot 750, and the like. In addition, an antenna is incorporated in the housing 741. At least one of the housings 740 and 741 is provided with the integrated circuit in the above embodiment. Thus, a cellular phone set in which data is written and read at high speed and power consumption is sufficiently reduced can be obtained.

FIG. 10E is a digital camera, which includes a main body 761, a display portion 767, an eyepiece 763, an operation switch 764, a display portion 765, a battery 766, and the like. In the main body 761, the integrated circuit in the above embodiment is provided. Thus, a digital camera in which data is written and read at high speed and power consumption is sufficiently reduced can be obtained.

Figure 10F:
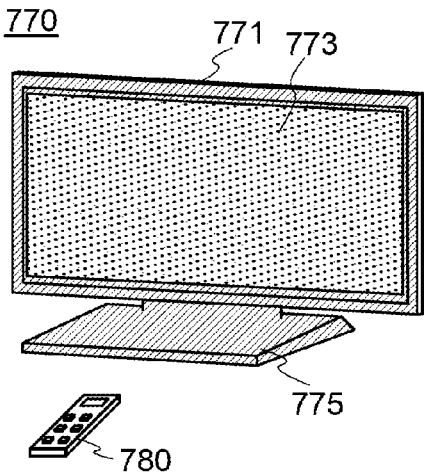

FIG. 10F is a television set 770, which includes a housing 771, a display portion 773, a stand 775, and the like. The television set 770 can be operated with an operation switch of the housing 771 or a remote control 780. The integrated circuit in the above embodiment is mounted on the housing 771 and the remote control 780. Thus, a television set in which data is written and read at high speed and power consumption is sufficiently reduced can be obtained.

As described above, the semiconductor devices described in this embodiment each include the integrated circuit according to the above embodiment. Thus, semiconductor devices with low power consumption can be obtained.

This application is based on Japanese Patent Application serial No. 2010-270534 filed with Japan Patent Office on Dec. 3, 2010, the entire contents of which are hereby incorporated by reference.

What is claimed is:

1. A circuit comprising:
a first flip-flop; and
a second flip-flop, the second flip-flop including a nonvolatile memory circuit,
wherein in an operating state in which power is supplied to the circuit, the first flip-flop retains data,
wherein in a resting state in which supply of power to the circuit is stopped, the second flip-flop retains data,
wherein on transition from the operating state into the resting state, the data is transferred from the first flip-flop to the second flip-flop, and
wherein on transition from the resting state into the operating state, the data is transferred from the second flip-flop to the first flip-flop.

2. The circuit according to claim 1 further comprising a selection circuit to which output data from the second flip-flop is input and which selectively outputs any one piece of the data input,
wherein output data from the selection circuit is input to the first flip-flop, and output data from the first flip-flop is input to the second flip-flop.

3. The circuit according to claim 1,
wherein the second flip-flop includes:
a memory circuit that includes a first transistor including an oxide semiconductor in a semiconductor layer and a storage capacitor; and
an arithmetic portion,
wherein in the memory circuit:
output data from the first flip-flop is input to a first electrode of the first transistor;
a second electrode of the first transistor is electrically connected to a first electrode of the storage capacitor;
a second electrode of the storage capacitor is grounded; and
the first electrode of the storage capacitor and the second electrode of the first transistor forms a node,
wherein the arithmetic portion includes a logic circuit,
wherein the logic circuit includes a second transistor whose gate electrode is electrically connected to the node, and
wherein the arithmetic portion performs operation in accordance with data retained in the node.

4. The circuit according to claim 3, wherein the first transistor, and the first flip-flop, the arithmetic portion of the second flip-flop, or the storage capacitor of the second flip-flop are stacked.

5. A semiconductor device comprising the circuit according to claim 1.

6. A circuit comprising a first flip-flop and a second flip-flop, the second flip-flop including a nonvolatile memory circuit,
wherein before a resting state in which supply of power to the first flip-flop and the second flip-flop is stopped, data retained in the first flip-flop is transferred to the second flip-flop, wherein in the resting state, the data is retained in the second flip-flop, and wherein after the resting state, the data in the first flip-flop is restored by the second flip-flop.

7. The circuit according to claim 6 further comprising a selection circuit to which output data from the second flip-flop is input and which selectively outputs any one piece of the data input, wherein output data from the selection circuit is input to the first flip-flop, and output data from the first flip-flop is input to the second flip-flop.

8. The circuit according to claim 6, wherein the second flip-flop includes:

a memory circuit that includes a first transistor including an oxide semiconductor in a semiconductor layer and a storage capacitor; and an arithmetic portion, wherein in the memory circuit:

output data from the first flip-flop is input to a first electrode of the first transistor;

a second electrode of the first transistor is electrically connected to a first electrode of the storage capacitor;

a second electrode of the storage capacitor is grounded; and the first electrode of the storage capacitor and the second electrode of the first transistor forms a node, wherein the arithmetic portion includes a logic circuit, wherein the logic circuit includes a second transistor whose gate electrode is electrically connected to the node, and wherein the arithmetic portion performs operation in accordance with data retained in the node.

9. The circuit according to claim 8, wherein the first transistor, and the first flip-flop, the arithmetic portion of the second flip-flop, or the storage capacitor of the second flip-flop are stacked.

10. A semiconductor device comprising the circuit according to claim 6.

11. A method for driving a circuit including a first flip-flop and a second flip-flop, the second flip-flop including a nonvolatile memory circuit, comprising the steps of:

storing first data in the first flip-flop in a first period;

outputting the first data from the first flip-flop and storing the first data in the second flip-flop in a second period after the first period;

stopping supply of power to the circuit in a third period after the second period;

restarting supply of power to the circuit and outputting the first data stored in the second flip-flop in a fourth period after the third period; and storing the first data in the first flip-flop in a fifth period after the fourth period.

12. The method for driving a circuit according to claim 11 further comprising the steps of:

storing second data in the first flip-flop in a sixth period after the fifth period.

13. A method for driving a circuit including a first flip-flop, a second flip-flop, the second flip-flop including a nonvolatile memory circuit, and a selection circuit comprising the steps of:

outputting first data from the selection circuit and storing the first data in the first flip-flop in a first period;

outputting the first data from the first flip-flop and storing the first data in the second flip-flop in a second period after the first period;

stopping supply of power to the circuit in a third period after the second period;

restarting supply of power to the circuit and outputting the first data stored in the second flip-flop to the selection circuit in a fourth period after the third period; and outputting the first data from the selection circuit to the first flip-flop and storing the first data in the first flip-flop in a fifth period after the fourth period.

14. The method for driving a circuit according to claim 13 further comprising the steps of:

outputting second data from the selection circuit in a sixth period after the fifth period.

15. A circuit comprising:

a first flip-flop; and a second flip-flop, wherein the first flip-flop comprises first transistors, each including a semiconductor material other than an oxide semiconductor in a semiconductor layer, wherein the second flip-flop comprises a second transistor including an oxide semiconductor in a semiconductor layer, wherein the second flip-flop includes:

a memory circuit that includes the second transistor and a storage capacitor; and an arithmetic portion, wherein one electrode of the second transistor is electrically connected to a first electrode of the storage capacitor, wherein the arithmetic portion includes a third transistor, and wherein a gate electrode of the third transistor is electrically connected to the one electrode of the second transistor.

16. The circuit according to claim 15 further comprising a selection circuit which is electrically connected to the first flip-flop and the second flip-flop.

17. The circuit according to claim 15, wherein the second transistor, and the first flip-flop, the arithmetic portion of the second flip-flop, or the storage capacitor of the second flip-flop are stacked.

18. A semiconductor device comprising the circuit according to claim 15.

* * * * *